(12) United States Patent
Cao

(10) Patent No.: US 11,873,573 B2
(45) Date of Patent: Jan. 16, 2024

(54) FIELD-EDITING TECHNOLOGY FOR QUANTUM MATERIALS SYNTHESIS USING A MAGNETIC FIELD LASER FURNACE

(71) Applicant: The Regents of the University of Colorado, a body corporate, Denver, CO (US)

(72) Inventor: Gang Cao, Broomfield, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 17/794,108

(22) PCT Filed: Jan. 21, 2021

(86) PCT No.: PCT/US2021/014330
§ 371 (c)(1),
(2) Date: Jul. 20, 2022

(87) PCT Pub. No.: WO2021/150692
PCT Pub. Date: Jul. 28, 2021

(65) Prior Publication Data
US 2023/0045854 A1  Feb. 16, 2023

Related U.S. Application Data

(60) Provisional application No. 62/964,232, filed on Jan. 22, 2020.

(51) Int. Cl.
*C30B 13/30* (2006.01)
*C30B 13/24* (2006.01)
(Continued)

(52) U.S. Cl.
CPC ............. *C30B 13/30* (2013.01); *C30B 13/24* (2013.01); *C30B 29/22* (2013.01); *C30B 30/04* (2013.01); *H01F 6/04* (2013.01)

(58) Field of Classification Search
CPC ......... C30B 13/30; C30B 13/24; C30B 29/22; C30B 30/04; H01F 6/04
See application file for complete search history.

(56) References Cited

U.S. PATENT DOCUMENTS

| 4,468,586 A | 8/1984 | Hohn |
| 4,866,230 A | 9/1989 | Ikeda et al. |

(Continued)

FOREIGN PATENT DOCUMENTS

| CN | 102321913 | * | 1/2012 |
| JP | 2007-145629 A | | 6/2007 |

OTHER PUBLICATIONS

Cao, Gang et al., "Quest For Quantum States Via Field-Altering Technology," Quantum Materials, 8 pages, 2020.

(Continued)

*Primary Examiner* — Robert M Kunemund

(57) ABSTRACT

Various embodiments include a device for producing structurally modified materials. In some embodiments, the device includes a floating zone furnace which holds a feed rod in contact with seed crystal. One or more laser diodes are then used to heat a portion of the feed rod and cause it to transition to a molten state. A magnetic field is applied to the floating zone to change the underlying crystal structure of the material as it solidifies upon exiting the floating zone. In some instances, the changes may include manipulating the bond angle of the crystal structure or altering the unit cell volume of the crystal. Changes in the crystal structure directly affect the electrical resistivity and/or the magnetization and other physical properties of the crystal.

19 Claims, 19 Drawing Sheets

(51) Int. Cl.
  *C30B 29/22*   (2006.01)
  *C30B 30/04*   (2006.01)
  *H01F 6/04*    (2006.01)

(56) References Cited

U.S. PATENT DOCUMENTS

2015/0153075 A1    6/2015  Voorhis
2019/0177874 A1*   6/2019  Akutsu ................. C30B 13/30

OTHER PUBLICATIONS

International Application No. PCT/US2021/014330, International Search Report, Written Opinion, 12 pages, Jul. 29, 2021.
Wikipedia, "Superconducting Magnet," 8 pages, Jan. 28, 2021.

* cited by examiner

FIELD-EDITING TECHNOLOGY FOR QUANTUM MATERIALS SYNTHESIS USING A MAGNETIC FIELD LASER FURNACE

RELATED APPLICATIONS

This application hereby claims the benefit of and priority to U.S. Provisional Patent Application No. 62/964,232, titled "FIELD-EDITING TECHNOLOGY FOR QUANTUM MATERIALS SYNTHESIS USING A HIGH MAGNETIC FIELD LASER FLOATING-ZONE FURNACE", filed on Jan. 22, 2020 and which is hereby incorporated by reference in its entirety.

STATEMENT REGARDING FEDERALLY SPONSORED RESEARCH

This invention was made with government support under grant numbers DMR1712101 and DMR1903888 awarded by the National Science Foundation. The government has certain rights in the invention.

TECHNICAL FIELD

Various embodiments of the present technology generally relate to quantum material synthesis. More specifically, some embodiments of the present technology relate to field editing for synthesizing quantum materials through application of a high magnetic field during material growth in a laser floating-zone furnace.

BACKGROUND

Techniques for floating-zone crystal growth were first developed in the early 1950s. This new technology permitted synthesis of ultrapure silicon single crystals, which was a critical underpinning for the development of many semiconductor devices. More recently, the floating-zone technique was improved by using halogen lamps and ellipsoidal mirrors for crystal growth of a wide range of metals and oxides. The resulting materials have proved to be of great fundamental and technological significance. In 2015, Crystal Systems Corporation® in Japan developed a furnace in which the halogen lamps were replaced by much more compact laser diodes, which eliminated the need for large ellipsoidal mirrors. These early developments open the door to a next generation field-editing technology that is specially adapted to crystal growth in strong magnetic fields, producing ultra-ordered, novel single crystals that are otherwise unavailable.

Materials with strong spin-orbit interactions and significant electronic correlations provide a promising setting to realize a vast array of novel quantum phases of matter. A major challenge facing the research community today is that a great deal of theoretical work addressing exotic states for strongly spin-orbit-coupled materials has thus far met very limited experimental confirmation. The conspicuous discrepancies between current theory and experiment are due chiefly to the extreme susceptibility of relevant materials to structural distortions and disorder. This is because the ground states of these materials are dictated by a highly delicate interplay between spin-orbit and Coulomb interactions. Consequently, any slight perturbations, such as distortions/disorder, could cause giant or non-linear responses in physical properties.

As such, there are a number of challenges and inefficiencies inherently existing in quantum materials with strong spin-orbit interactions. For example, current methods to produce these materials are unable to avoid structural distortions and disorder, which are common occurrence, or to "edit" structures when producing these materials. Thus, it can be difficult to realize theoretically predicted exotic states or materials. It is with respect to these and other problems that embodiments of the present technology have been made.

SUMMARY

Systems and methods are described for producing novel crystal structures through the application of a magnetic field. Various embodiments provide for a technology for single-crystal synthesis that "field-edits" or modifies crystal structures via the application of magnetic fields during crystal growth. Field-editing crystal structures is accomplished by a laser floating-zone furnace (2600 C) with a superconducting magnet of 10 Tesla for single-crystal synthesis of quantum materials. Some embodiments of the system open an entirely new dimension for synthesis of highly ordered, novel single crystals of spin-orbit-coupled materials unavailable otherwise to underpin discoveries of new quantum states. The development of emerging quantum technologies increasingly requires initial fundamental studies of bulk single crystals, as well as successful integration of their novel properties into state-of-art device structures. Technologies disclosed herein yield a next-generation synthesis technology for single crystals with novel characteristics that cannot be produced via other techniques.

In some embodiments, a method for structural modifying the crystalline structure of materials during crystal growth at high magnetic fields and high temperatures is presented. In some embodiments, the method enables discoveries of novel materials/states otherwise unavailable when using traditional production methods. The method of combining the two extreme conditions (e.g., 10 Tesla and 2600 C) for materials synthesis is unique. In some embodiments, the method includes three central components, namely, focusing an array of five laser diodes to generate a high-temperature zone or floating zone within a furnace, generating a magnetic field through the use of a superconducting magnet surrounding the floating-zone to modify structures during crystal formation, and cooling the magnet through using a cryofree cooling system to cool the magnet and provide an insulating thermal shield between the magnet and the floating-zone.

In some embodiments, a method for structurally modifying crystals is presented. Some embodiments include focusing the laser light emitted by one or more laser diodes at a floating zone within a furnace that is dedicated to crystal growth. The floating zone includes a seed crystal or seed rod as well as a feed rod in contact with the seed crystal. The laser light heats a portion of the feed rod and the seed crystal to a molten state or semi-molten state. A magnetic field is applied to the floating zone which causes the crystalline structure of the molten material to change as it solidifies upon exiting the floating zone.

In some embodiments, the magnetic field is generated by a superconducting solenoid. The internal temperature of the magnet is reduced to cryogenic temperatures, below that of the critical temperature of the magnet. Once the temperature of the magnet is below the critical temperature, the electrical resistance of the magnet becomes zero, thus allowing for exceedingly large currents to be sent through the superconducting solenoid to generate the strong magnetic field. Excess heat is removed from the floating zone. In some embodiments, the total amount of heat removed from the floating zone is equal to the total amount of heat added to the floating zone by the laser diodes. By equalizing the amount of heat removed to the amount of heat added, the temperature of the floating zone is held constant.

Further embodiments reflect at least a portion of the heat radiated from the floating zone back to the floating zone. In some embodiments, reflecting the heat utilizes one or more radiation shields or other types of high temperature reflective shields. In addition to the radiation shields, removing the heat from the floating zone utilizes a conductive heat sink to absorb excess heat emitted by the floating zone. The heat sink, in some embodiments, is operatively coupled to a refrigeration system to provide the necessary cooling to handle the heat absorbed by the heat sink. In some embodiments, the heat sink is positioned between the floating zone and the superconductive magnet to prevent the transfer of heat between the floating zone and the superconductive magnet, thereby thermally decoupling the floating zone and the superconductive magnet. In accordance with various embodiments, the method is operated in a vacuum environment to prevent convective heat transfer or the condensation of gas onto the cryogenic components.

In contrast, other embodiments call for a system for structurally modifying crystalline materials. The system includes one or more laser diodes configured to supply thermal energy to material within a molten zone. In some embodiments, the molten zone includes at least a quartz tube which houses a rotating feed rod in contact with a rotating seed crystal where the rotating feed rod is configured to absorb thermal energy from the one or more laser diodes. In various embodiments, the system includes a magnet which includes a superconducting solenoid, a heat shield, and a cryogenic system. The superconducting solenoid operates at a temperature below the critical temperature needed to cause the superconducting solenoid to enter a superconductive state. Once in the superconductive state, an electrical current is passed through the solenoid to generate a magnetic field. The magnetic field is directed at the seed crystal and the feed rod to modify a crystal structure of the material as it solidifies upon exiting the molten zone.

The heat shield encloses the superconducting solenoid to prevent the transfer of thermal energy to and from the superconducting solenoid. The cryogenic system is coupled to the superconducting solenoid to maintain the temperature of the solenoid. In other embodiments, an insulation system is positioned between the molten zone and the magnet to further prevent the transfer of thermal energy between the molten zone and the magnet. The insulation system, in some embodiments, includes at least a heat sink and one or more passive radiation shields. The heat sink is configured to absorb thermal energy emitted from the molten zone while the one or more passive radiation shields can be configured to reflect thermal energy radiated by the molten zone, back to the molten zone.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

FIGS. 10-12 illustrate the effect of field-editing on physical properties of $Ba_4Ir_3O_{10}$.

Figure 1A:
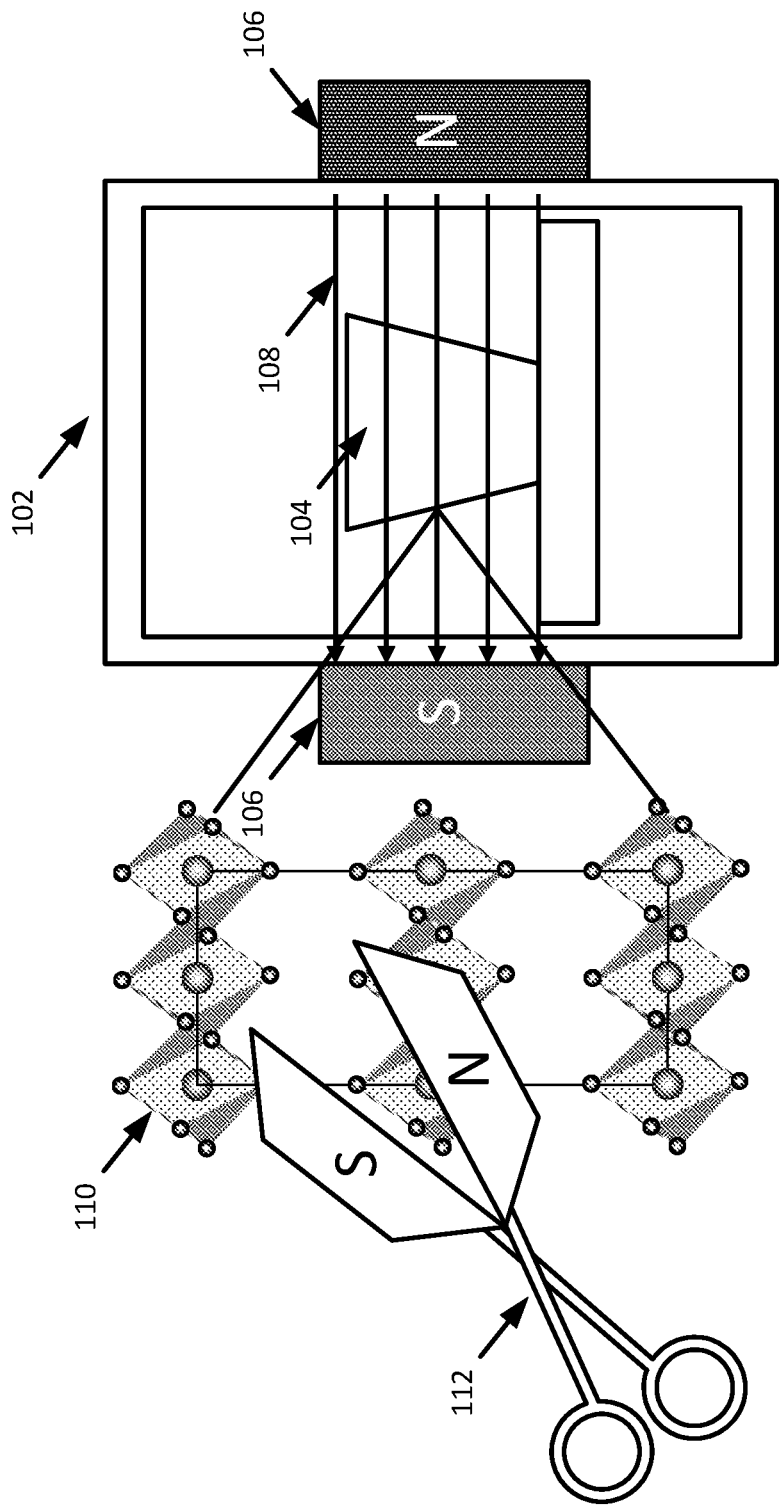
FIG. 1A illustrates a schematic for field-editing a crystal structure during crystal growth in the molten or floating zone.
Figure 1C:
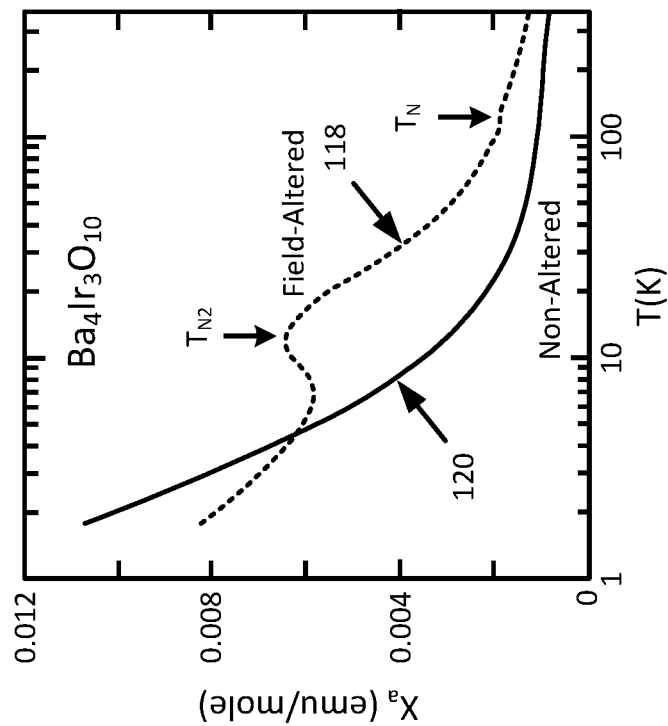
FIG. 1B illustrates changes in c-axis resistivity ($\rho_c$) of $Sr_2IrO_4$ between crystals grown in the presence of the magnetic field (Field-Altered) and crystals grown without a magnetic field (Non-Altered).

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology relate generally to the synthesis of novel quantum materials. Physics of this class of materials is dictated by a rare combined effect of spin-orbit and Coulomb interactions and is among the most current and extensively studied topics. A great deal of theoretical work predicting exotic states (e.g., novel superconductivity, topological states, quantum spin liquids, etc.) for strongly spin-orbit-coupled materials has thus far met very limited experimental confirmation. A good example is $Sr_2IrO_4$ which is a novel, spin-orbit-driven magnetic insulator. It is widely anticipated that with slight electron doping, $Sr_2IrO_4$ should be a novel superconductor. However, there has been no experimental confirmation of superconductivity, despite many years of experimental effort. The absence of the predicted superconductivity is in part due to inherently severe structural distortions that suppress superconductivity.

In some embodiments, $Sr_2IrO_4$, doped $Sr_2IrO_4$, $Ca_2RuO_4$, $Ba_4Ir_3O_{10}$ were field-edited at high temperatures and under an applied magnetic field. The resulting materials exhibited structural, magnetic and transport properties that are either drastically improved or changed, compared to those of non-edited samples. In particular, an abrupt drop in electrical resistivity below 20° K in field-edited, 3% electron-doped $Sr_2IrO_4$ suggests that the long-elusive superconductivity in the material may be finally within reach. Furthermore, the field-edited structure of $Sr_2IrO_4$ is less distorted (Ir—O—Ir bond angle becomes larger), and the antiferromagnetic transition is suppressed by 90° K and the resistivity is reduced by five orders of magnitude.

Raman data for these field-edited materials also reflects the magnetic change. The field-editing is also effective to 4 d-transition metal oxides. For example, $Ca_2RuO_4$ is an antiferromagnet with the Neel temperature $T_N$=110° K when non-edited but becomes a ferromagnet with a Curie temperature $T_C$=140° K when field-edited. In general, the conspicuous discrepancies between current theory and experiment are due chiefly to the extreme susceptibility of relevant materials to structural distortions and disorder, and all these spin-orbit-coupled materials are inherently distorted. In further embodiments, when a magnetic field 100 times stronger is applied, novel quantum states and materials are created.

In other embodiments, materials having strong spin-orbit interactions are field-edited as these materials tend to lock magnetic moments to the lattice, thus resulting in a strong magnetoelastic coupling, which facilitates field-editing. To elucidate the effects of field editing on a variety of materials, field-edited 5d-transition metal oxides are observed using Raman scattering, time-resolved Raman scattering, resonant inelastic x-ray scattering (RIXS), and time-resolved resonant x-ray scattering (RXS). In particular, the Raman scattering spectra of $Sr_2IrO_4$ single crystals that are field-edited and non-edited are observed. The field-edited single crystals are grown in a proof-of-concept setup according to some embodiments of the present technology. One most striking result is that the one-magnon peak, which is prominent in the data of the non-edited $Sr_2IrO_4$ at 18 cm$^{-1}$, is absent in the field-edited sample. This observation, together with the suppressed Neel temperature indicates that the magnetic moments are more weakly pinned by the crystal field. The magnon spectrum in the two samples is different also, as indicated by the different lineshapes of the two-magnon scattering peak (not shown). It is interesting that the crystal structure of the two samples is not very different as indicated by nearly identical phonon spectra.

Various embodiments of the present technology provide for an instrument that will offer a unique opportunity to study magnon Raman scattering of field-edited materials. Specifically, some embodiments of the instrument enable Raman measurements utilized to probe one-magnon and two-magnon Raman scattering as well as the zone center phonons. Some embodiments will further allow for resonant inelastic x-ray scattering (RIXS) to map out magnon dispersions as well as electronic excitations with the results to be compared to non-edited materials. Additionally, some embodiments further the investigation of magnons as well as phonons in field edited and non-edited $Sr_2IrO_4$ in a time-resolved mode. Time-resolution is an order of magnitude better than previous time-resolved RIXS experiments probing magnons. The resulting shored time-resolution allows for shorter times probing and see stronger effects.

Some embodiments include flux and vapor transport single-crystal growth as well as transport and magneto-crystalline anisotropy in quantum magnets. New phases of interest are sought in the regions of phase diagram of a material, where the competition among multiple adjacent energy scales leads to highly entangled quantum states. Thermal transport measurements have proven a powerful and versatile probe to identify coherent low-energy, itinerant excitations. Moreover, thermal transport measurements also offer information on characteristics of spin-phonon coupling by observing how phonon heat conduction—the default heat channel in insulating crystalline solids—gets enhanced or hampered by other degrees of freedom. Tangible experimental evidences for such cases provide model systems for quantum entanglement in naturally occurring materials and enable development of material-platforms for next-generation quantum technologies.

The field-editing technology offers a completely new dimension in the search for naturally occurring, correlated quantum systems. This is because both thermal transport and magneto-crystalline anisotropy characteristics are intimately related to spin-lattice interactions in quantum spin systems. A strong magnetic field applied during high-temperature synthesis alters the free energy landscape for spin degrees of freedoms, which is to be translated into considerable alterations in lattice properties such as distortions and anisotropy. Comparing the experimental results between "field-edited" materials and their "non-edited" counterparts provides unique opportunities to understand the origins of magnetoelastic coupling and resultant peculiar magnetism often observed in 4 d and 5 d compounds.

Some embodiments call for synthesizing and characterizing novel magnetic topological materials through the use of field-editing. Establishing a nontrivial topological phase requires specific crystal and magnetic structures. By controlling the synthesis and process conditions, stability in magnetic topological materials is ensured. For example, in the system of intrinsic magnetic topological insulators based upon $MnBi_2Te_4$-type compounds that are believed to be critical for implementing the anomalous quantum Hall effect (AQHE) at reasonable temperature and field scales, recent calculations based on the relativistic spin-polarized density function theory (DFT) indicate strong cooperation between different crystal and magnetic structures, i.e. a tiny change in the crystal structure is expected to lead to a major change in the spin structure.

Some embodiments disclose producing quantum frustrated magnetism, which leads to novel phases of matter such as quantum spin liquids or Skyrmion lattices. The former is a highly sought-after phase of matter that hosts fractional quasi-particles and could be used for topological quantum computations. The latter is of interest in spintronics applications. The nature of frustration, which entails a delicate balance of magnetic interactions, leads to high degeneracies of the magnetic state and ultimately this paves the way for unusual emergent phenomena. However, by its very nature, the delicate balance can also easily be influenced by small, perhaps unwanted, perturbations. The quality of the underlying crystal lattice, such as whether or not it has local strains or other imperfections, can make a very big difference in the observed behavior of frustrated materials. It is imperative to have access to growth techniques that promote well-ordered crystal structures, with low impurity concentrations, all while maintaining a large sample volume.

Further embodiments include a laser floating zone furnace which enables growths of tricky compounds (such as incongruent melters or highly volatile compounds). More importantly, the floating zone furnace includes the ability to apply and tune a large magnetic field during crystal growth as well as a way to more subtly tune the level of crystalline disorder. Presently investigating these classes of materials can only be done systematically by making chemical substitutions (alloying), which often has very severe consequences for local structure and can dramatically alter the magnetic state. These problems are particularly challenging for those compounds which have weak magnetic interaction strengths, such as ytterbium-based quantum materials, which are of high importance in modern quantum magnetism investigations. The floating zone furnace enables more subtle changes to structures to be made, while also enabling more difficult crystal growths to be successful. This impacts the field of quantum materials by enabling materials to be tuned towards a quantum spin liquid phase.

In some example embodiments, a floating zone furnace permits crystal growth at high magnetic fields (up to 10 Tesla) and high temperatures (up to 2600 C). A superconducting solenoid winding surrounds the floating zone where crystallization occurs in order to "edit" distortions or promote modifications of the growing crystal. Five individual, 200 W laser diodes are coupled via optical fibers and lenses in order to focus 1000 W of power at the floating zone/molten zone. The superconducting solenoid generates an applied magnetic field up to 10 Tesla at the molten-zone, which requires a large, 4.1" solenoid bore with five optical windows surrounding the floating zone. The superconducting operation of the solenoid is accomplished by a series of cryocoolers. Radiation shield tubes are in place to shield the solenoid winding from the heat radiated by the molten zone. Besides floating zone growth, this floating zone furnace also allows flux growth by placing a metal crucible (e.g., W, Pt) at the molten zone but controlled via diffused laser light.

In some embodiments, a 1500° C. conventional furnace incudes two permanent magnets, each of which is of 1.4 Tesla. Since the magnetic field of a permanent magnet decays with distance d as $1/d^3$, the actual strength of the magnetic field inside the furnace chamber is estimated to be 0.1 Tesla. Compositions of matter comprising compounds including 4 d-transitional and 5 d-transition metals can be used as test materials for single crystal growth in this setup. Some of the results obtained using this proof-of-concept setup are presented in FIGS. 7-19. These results are substantial: structural, magnetic and transport properties of these field-edited materials are drastically changed, compared to those of the same but non-edited materials, despite the tiny applied magnetic field. It works largely because these spin-orbit-coupled materials are dictated by a rare, delicate interplay between the fundamental interactions have a strong magnetoelastic coupling and are extremely susceptible to even small external stimuli; additionally, the magnetic field can affect electrically conducting liquids in general. The proof-of-concept results offer a glimpse of how powerful this technology can be with a magnetic field 100 times stronger than that of the proof-of-concept setup.

The field-editing technology will expand the capabilities of a laser furnace, which grows single crystal samples via intense heat, by allowing the sample to be grown inside a high magnetic field with field strength of order 10 Tesla. Magnetic fields of this magnitude are typically generated by a superconducting magnet which requires cooling to 4° K. Some embodiments insert the furnace inside of a superconducting magnet while removing enough heat to allow the magnet to function properly such that the high magnetic field can penetrate the sample during crystal growth.

Various embodiments combine a laser furnace and a superconducting magnet into a single unit while allowing each to function while they operate at drastically different temperatures. The laser furnace operates at very high temperatures in order to bring samples to their melting points which, for a typical growth, are around 1700° C. but can be as high as 2600° C. for certain materials. These high temperatures are achieved by heating the sample with upwards of 1000 W of visible and/or infrared (IR) laser light. The superconducting magnet operates at cryogenic temperatures, usually 4° K, in order to cool a large coil of superconducting wire below its critical temperature ($T_C$) such that the resistance of the wire goes to zero. With zero resistance, large electrical currents can be driven through the coil to produce very high magnetic fields.

When combining these two devices into a single system, in some embodiments, a refrigeration device is inserted between the magnet and the laser furnace to insulate the space between to reduce the total amount of heat transferred. The functionality of this new concept is enabled by balancing the total input and output power of the system in order to allow constant temperature of its components. For the floating zone, 1000 W of power is input into the furnace. As a consequence, 1000 W must also be removed such that the temperature of the floating zone and the magnet remain unchanged. By inserting a 1000 W capable refrigerator between them, the floating zone and the furnace can each operate independently.

Various embodiments of the present technology provide for a wide range of technical effects, advantages, and/or improvements. For example, various embodiments include one or more of the following technical effects, advantages, and/or improvements: 1) altering the crystal structure of a variety of substances through the application of a magnetic field during molten crystal growth using either laser floating zone or flux technique; 2) a floating zone furnace augmented with a high strength superconducting magnet for the field editing of substances; 3) creation of novel quantum materials through the use of field editing; 4) operation and control of a high magnetic field laser furnace; and/or 5) field editing known materials to exhibit a variety of desired electrical and magnetic properties.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. While, for convenience, embodiments of the present technology are described with reference to field-editing crystals during molten crystal growth through the application of a magnetic field.

FIG. 1A illustrates a schematic for field-editing a crystal structure during crystal growth in the molten or floating zone. Field-editing can be accomplished by first heating a material into a molten state. In some embodiments, heating is accomplished by heating the crystal with one or more IR laser diodes. Once the material is melted crystal growth commences. During the growth phase, a magnetic field is applied to the molten material which results in a change in underlying crystal structure as the material solidifies upon exiting the molten or floating zone.

In this example embodiment, crucible 104 containing the material is heated within a molten zone of furnace 102. Magnet 106 creates a magnetic field 108 in the molten zone of furnace 102. This magnetic field 108 acts as a tool 112 to modify the crystal structure 110 of the material.

Figure 1B:
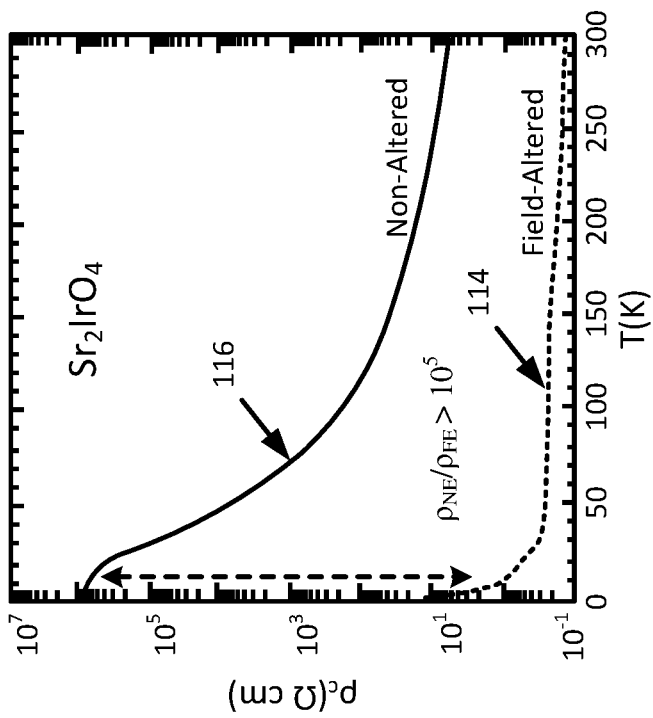

FIG. 1B illustrates changes in c-axis resistivity ($\rho_c$) of $Sr_2IrO_4$ between crystals grown in the presence of the magnetic field 108 (Field-Altered) and crystals grown without a magnetic field (Non-Altered). In this example embodiment using $Sr_2IrO_4$, the c-axis resistivity $\rho_c$ is five orders of magnitude smaller in the field-altered crystal 114 than in the non-altered counterpart 116.

Figure 10:
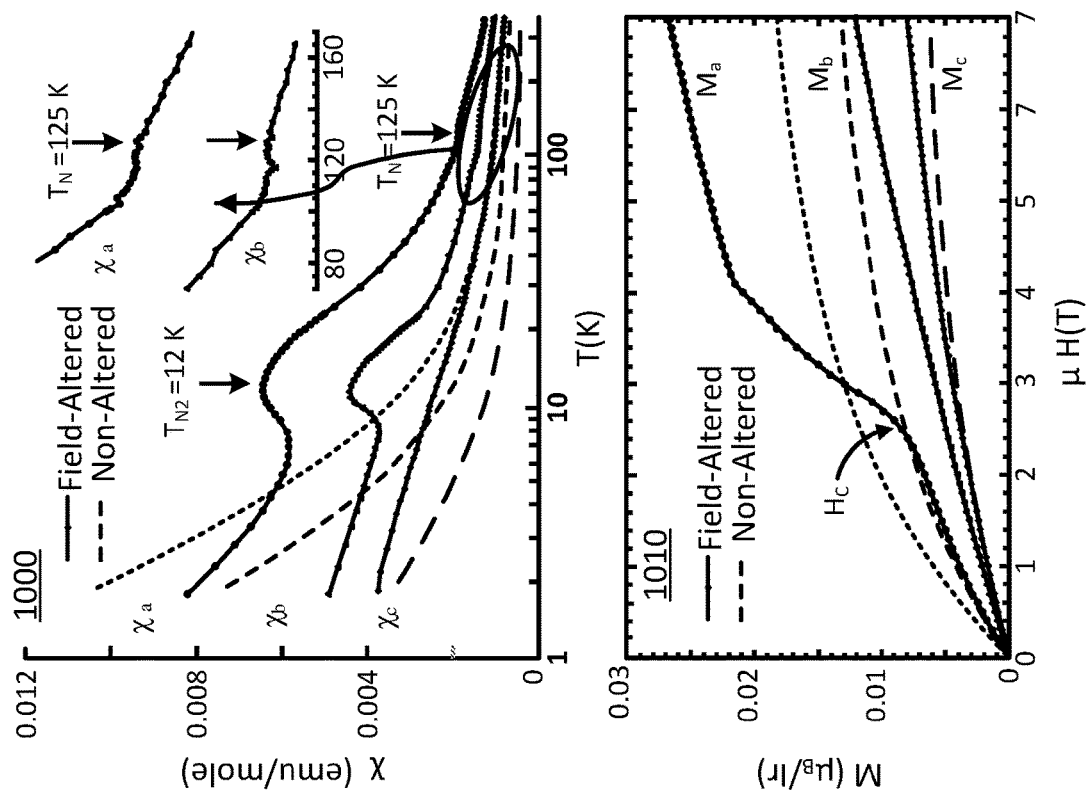
FIG. 10 illustrates changes in a-axis magnetic susceptibility ($\chi_a$) of $Ba_4Ir_3O_{10}$ between crystals grown in the presence of the magnetic field (Field-Altered) and crystals grown without a magnetic field (Non-Altered).

FIG. 10 illustrates changes in a-axis magnetic susceptibility ($\chi_a$) of $Ba_4Ir_3O_{10}$ between crystals grown in the presence of the magnetic field 108 (Field-Altered) and crystals grown without a magnetic field (Non-Altered). In this example embodiment using $Ba_4Ir_3O_{10}$, differences in the a-axis magnetic susceptibility $\chi_a$ between the non-altered crystal 120 that features a quantum liquid and the field-altered crystal 118 that becomes an antiferromagnet with two magnetic transitions are substantial.

Figure 2A:
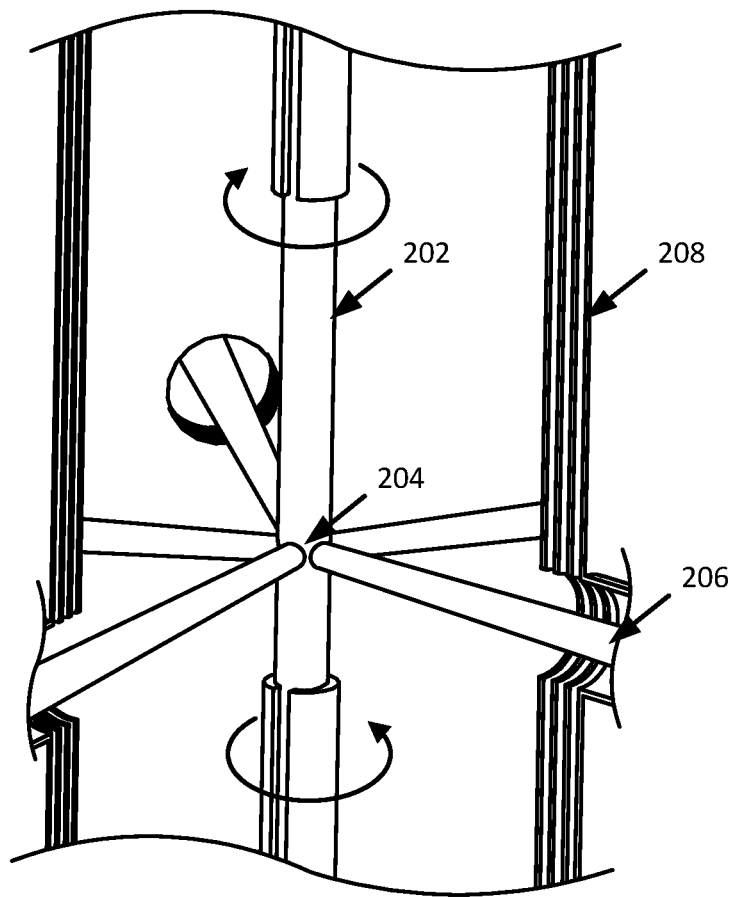
FIGS. 2A-2C are illustrations of a molten zone or floating zone furnace with a superconducting magnet in accordance with some embodiments of the present technology.
Figure 2B:
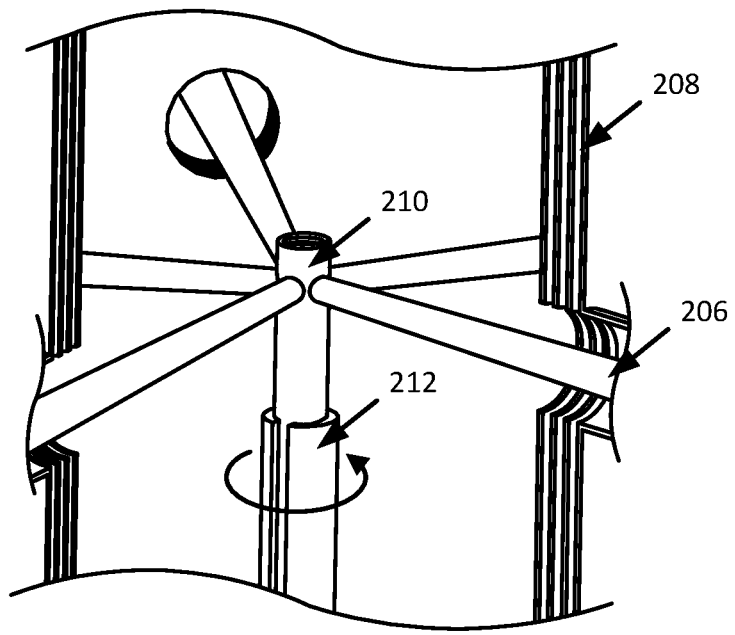
Figure 2C:
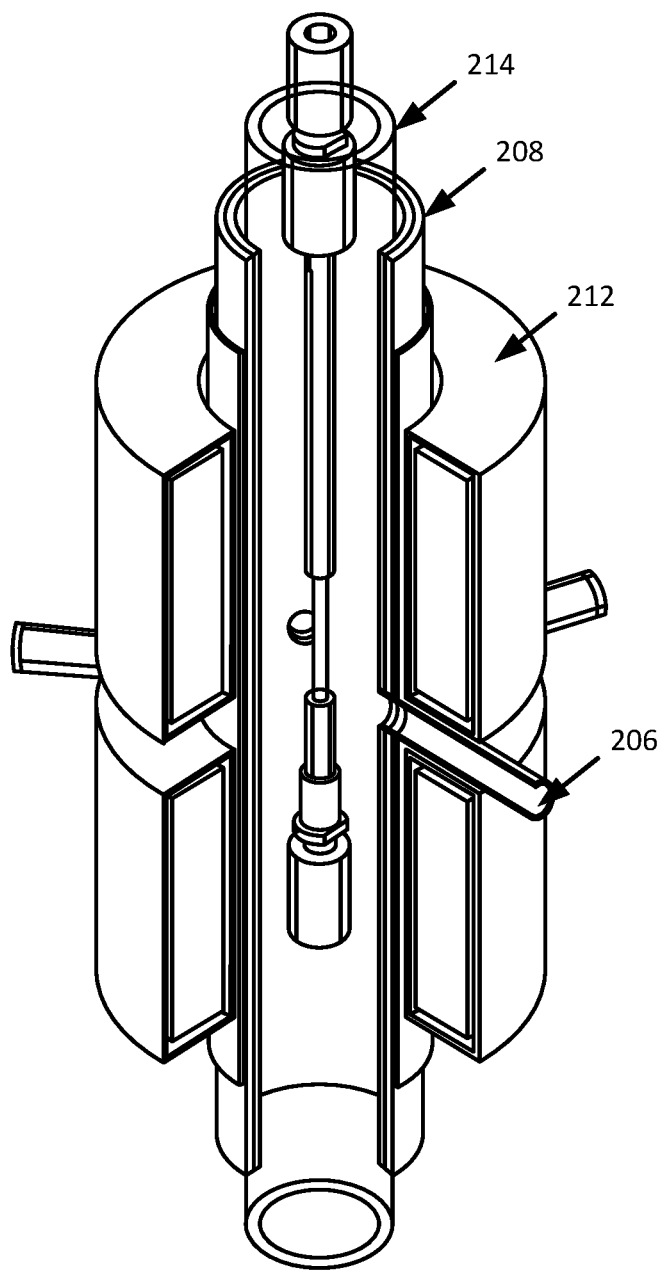

FIGS. 2A-2C are illustrations of a molten zone or floating zone furnace with a superconducting magnet in accordance with some embodiments of the present technology. FIG. 2A illustrates a floating-zone furnace setup according to one or more embodiments. The floating zone includes a rotating feed rod 202 that is heated by five laser beams 206 at a floating zone 204. This example furnace also includes insulation 208.

FIG. 2B illustrates an exemplary setup for flux crystal growth according to some embodiments. The flux growth setup includes a metal crucible 210 placed on a rotating holder 212 and is heated by five diffused laser beams 206 in a molten zone. This example furnace also includes insulation 208.

FIGS. 2A and 2B illustrate an exemplary system for producing structurally modified crystals. This system is configurable as illustrated in FIGS. 2A and 2B to operate either as a molten zone furnace or a floating zone furnace simply by switching out several internal components that support the material in either a molten zone or a floating zone. In the molten zone furnace configuration, the system produces structurally modified crystals using a flux technique.

In the molten zone furnace configuration structurally modified crystals are produced as the temperature within the molten zone is slowly reduced. In an example embodiment, this temperature reduction is achieved by lowering the power of the five diffused laser beams from the laser diodes. In another example embodiment, the floating zone furnace configuration structurally modified crystals are produced as the feed rod and seed crystal moved such that they slowly leave the floating zone and crystals form as the molten material cools upon exiting the floating zone.

FIG. 2C illustrates an exemplary furnace for field-editing crystals consistent with one or more embodiments of the present technology. The furnace, which includes a quartz tube 214, a sample feed-rod suspended from above, and a crystal seed supported from below is heated by radial laser diode inputs 206 to supply thermal energy to the floating zone within the furnace.

In some embodiments, each of the laser diodes supplies 200 W of thermal energy to the furnace. The superconducting magnet 212 includes a 4K coil and a 45K heat shield where the direction of the magnetic field produced by the coil is vertical. The furnace and magnet are separated by passive radiation shields to reduce heat transfer and a 130K radiation shield acts as a heat sink capable of removing over 1000 W of power. In some example embodiments, the magnet bore is 4.1" and the quartz tube enclosing the floating zone is 2.0" in diameter.

FIG. 2C illustrates a cross-sectional schematic of the furnace and magnet design. The floating zone is located in the center of a quartz tube 214 at the focus of five 200 W IR laser diodes through radial ports 206. This IR light heats a feed rod, suspended from above, until molten while in contact with a seed crystal supported from below inside of the tube. The superconducting magnet coil 212 surrounding the molten-zone is cooled to 4K by a cryocooler which also cools a 45K radiation shield that encloses the coil. This 45K shield is intended to prevent 300K black-body radiation from impinging on the coil and heating it but is only capable of removing 40 W so the intense radiation from the furnace would quickly overpower it.

To better isolate the furnace from the magnet, multiple layers of thin, reflective heat shields 208 are positioned around the furnace to reduce the amount of heat radiated away from the floating zone and contain it more locally so that the same crystal growth temperature can be attained with a smaller laser input power. The heat that does eventually make it outside of these shields is captured and removed by a highly conductive copper shield at 130° K which is connected to its own large dedicated 1000 W cryocooler. This shield is constructed in such a way that there is no line-of-sight from the hot floating zone to the 45° K magnet shield so all leakage IR radiation through the laser input ports will miss the 4° K magnet completely. These multiple layers of passive and active isolating shields 208, as well as dedicated cryocoolers for the magnet 212 and heat sink, allow the furnace and magnet to be completely thermally decoupled, allowing the furnace to operate over its entire range of temperatures while keeping the magnet at a constant 4° K.

Figure 3:
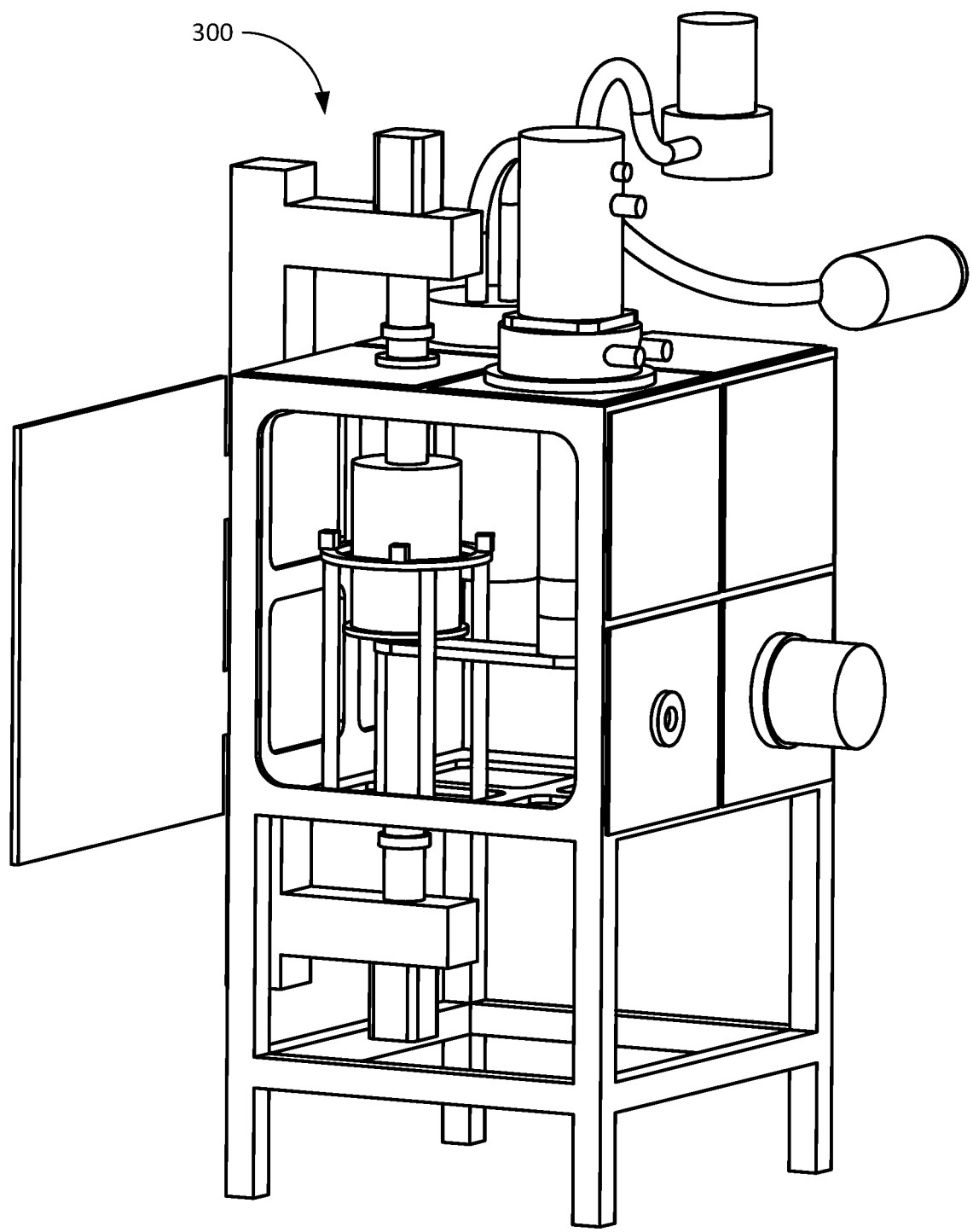
FIG. 3 illustrates an example embodiment of a system for a floating zone furnace with integrated superconducting magnet and isolation shields.

FIG. 3 illustrates an example embodiment of a system 300 for a floating zone furnace with integrated superconducting magnet and isolation shields. The entire system is contained in a vacuum enclosure to prevent gases from freezing and developing ice on the cryogenic components, and to prevent thermal conductivity from the hot furnace to the cold magnet via gas conduction and convection. The two dedicated pulse tube (PT) cryocoolers that cool the magnet and heat sink shield are installed vertically to operate, as does the float zone furnace to allow the feed rod to hang under gravity. These restrictions require a vacuum chamber with ample area on its top surface to allow space for all components, so a square chamber is chosen. This type of chamber also has the benefit of removable panels on all sides for ease of access during assembly and allows for adaptation to different configurations. The size of this system design is comparable or more compact than commercial floating-zone furnaces, even with the addition of the cryocooling system.

Other embodiments call for focusing (from focused to diffused) of the laser light onto the molten zone to reduce the temperature gradient and to allow for different sizes of feed rods or crucibles. A large temperature gradient causes large thermal shock and has been an issue with commercial laser floating zone furnaces. This setup also provides the ability to diffuse the laser light for flux growth for uniform heat distribution on the crucible. In summary, there are three major components of this instrument: 1. an array of five laser diodes to generate the floating zone, 2. a superconducting magnet for field-editing, and 3. a cryocooling system for the magnet and thermal shield around the high-temperature zone. This instrument enables the field-editing or modification of crystal structures or distortions and promotes novel characteristics otherwise unavailable during crystal growth by tuning the strength of the magnetic field.

Figure 4:
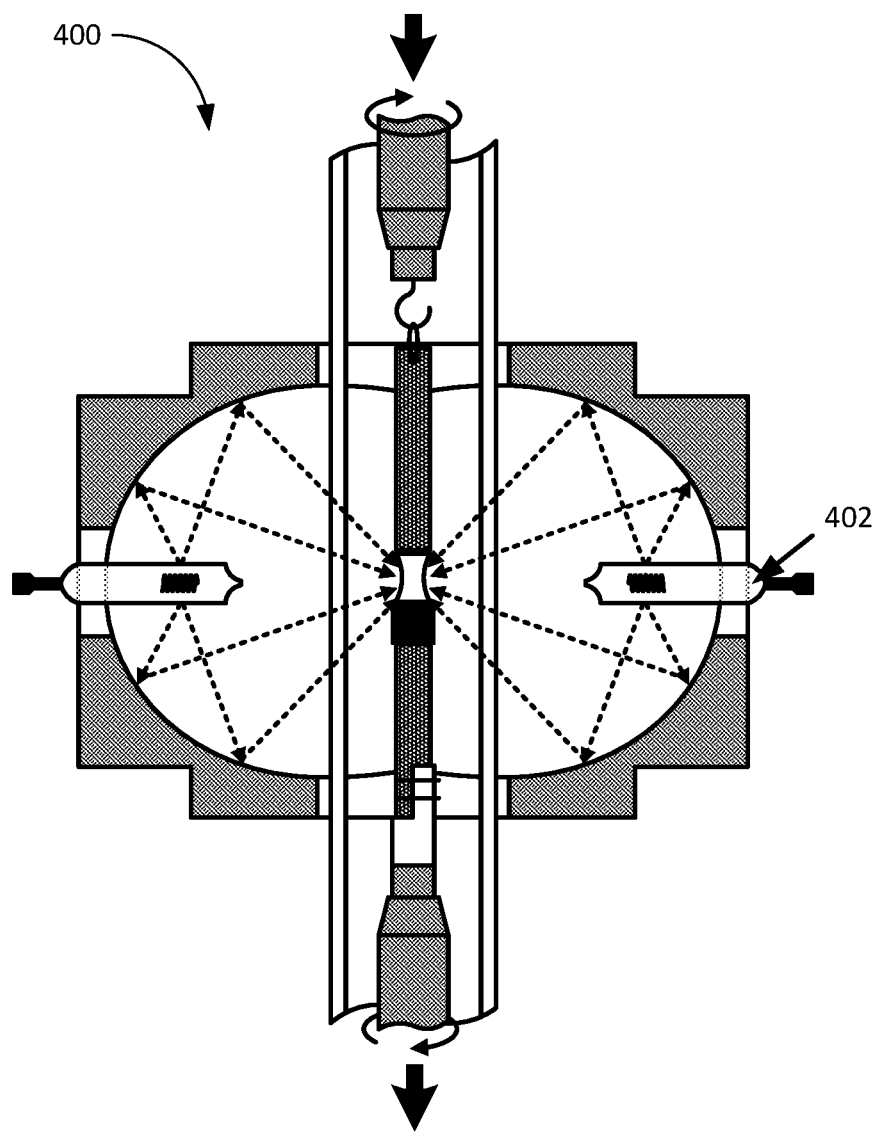
FIG. 4 illustrates a schematic of a floating or molten zone in an optical furnace according to one or more embodiments of the present technology.

FIG. 4 illustrates a schematic 400 of a floating or molten zone in an optical furnace according to one or more embodiments of the present technology. The floating zone includes a quartz tube which includes a controlled environment. Inside the controlled environment is a feed rod and a seed rod and a crystal. The molten zone exists between the feed rod and the crystal. In this example, the crystal is heated by a halogen lamp 402. Each the feed rod, seed rod, and crystal are rotated during furnace operation.

Figure 5:
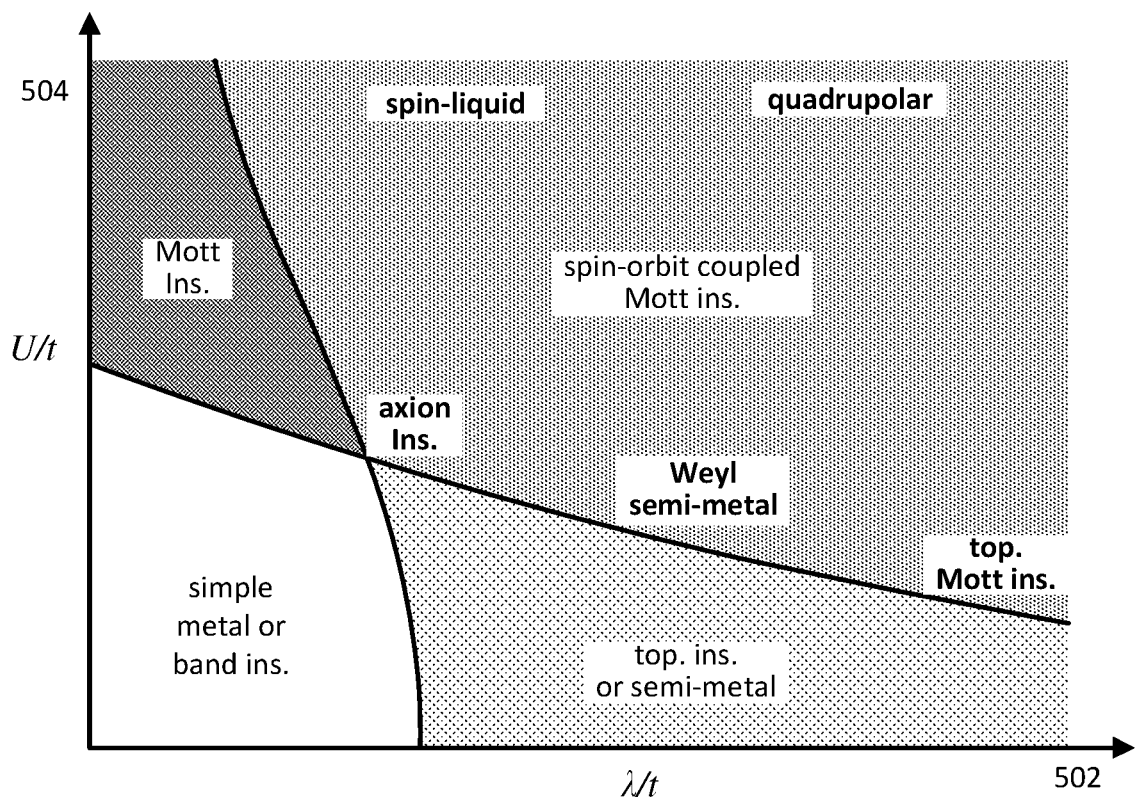
FIG. 5 is a phase diagram illustrating spin-orbit and Coulomb interactions according to one or more embodiments of the present technology.

FIG. 5 is a phase diagram illustrating spin-orbit ($\lambda$) 502 and Coulomb (U) 504 interactions according to one or more embodiments of the present technology.

Figure 6:
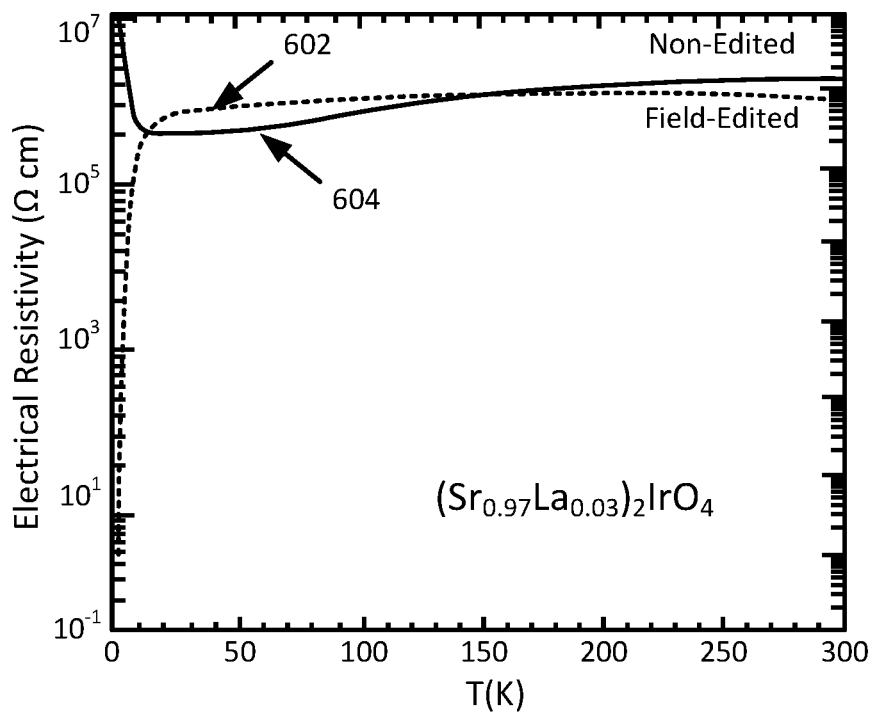
FIG. 6 is a plot illustrating electrical resistivity of a field-edited crystal according to one or more embodiments of the present technology.

FIG. 6 is a plot illustrating electrical resistivity of a field-edited crystal of $Sr_2IrO_4$ according to one or more embodiments of the present technology. In this example embodiment, the electrical resistivity of the field-edited crystal 604 shows evidence for the long-sought superconductivity in electron doped $Sr_2IrO_4$ in comparison to the non-edited crystal 602.

Figure 7A:
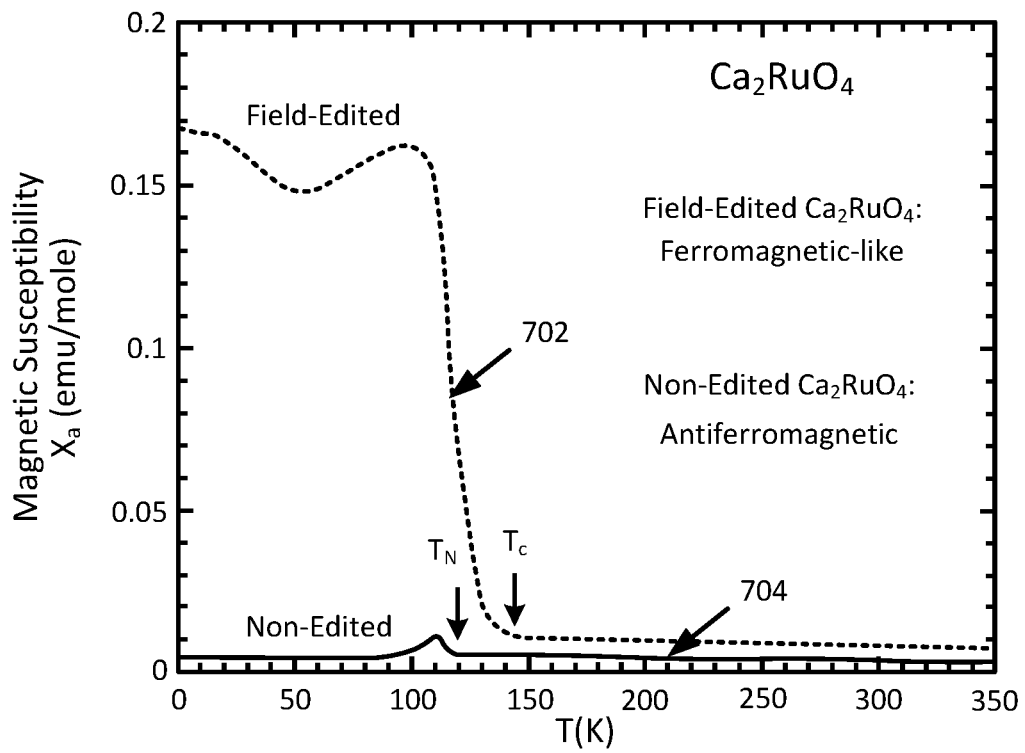
FIGS. 7A and 7B illustrate the effect of field-editing on $Ca_2RuO_4$ and $Ba_4Ir_3O_{10}$.
Figure 7B:
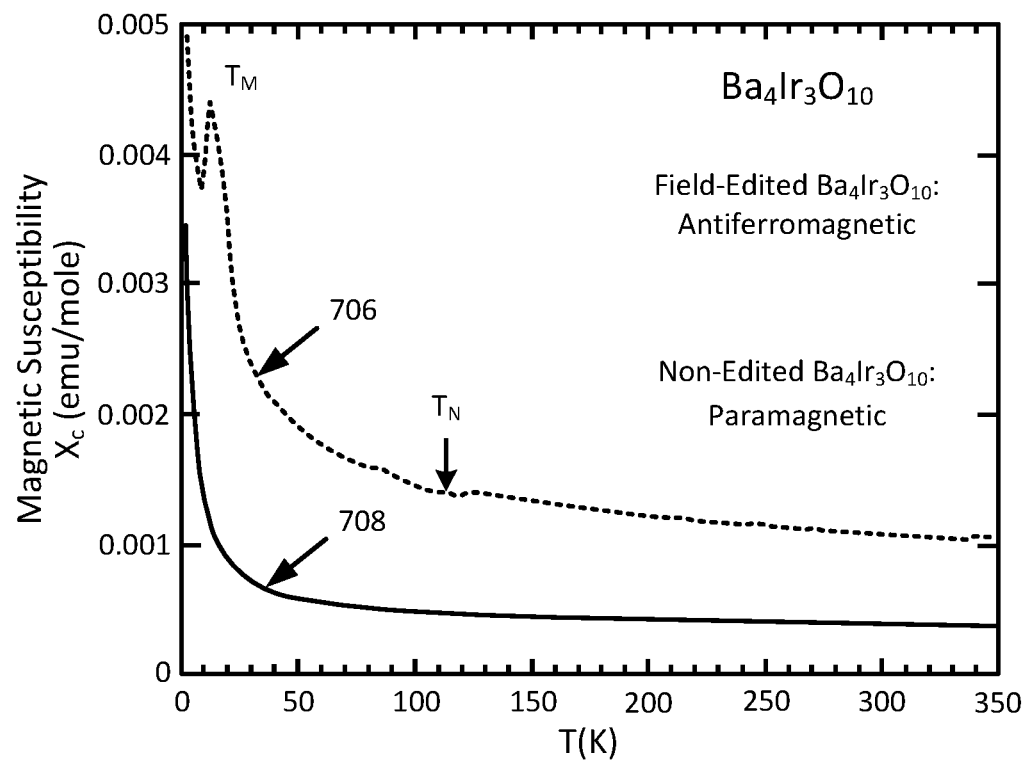

FIGS. 7A and 7B illustrate the effect of field-editing on $Ca_2RuO_4$ and $Ba_4Ir_3O_{10}$. FIG. 7A illustrates the change in magnetic susceptibility and magnetic state of Mott insulator $Ca_2RuO_4$ within field-edited crystals 702 and non-edited crystals 704. FIG. 7B illustrates the change in magnetic susceptibility and magnetic state of Mott insulator $Ba_4Ir_3O_{10}$ within field-edited crystals 706 and non-edited crystals 708.

In example experiments demonstrating various embodiments of the present invention, single crystals of $Ba_4Ir_3O_{10}$, $Ca_2RuO_4$ and $Sr_2IrO_4$ were grown using a flux method. The mixtures were fired at 1460 C, 1420 C and 1470 C for $Ba_4Ir_3O_{10}$, $Ca_2RuO_4$ and $Sr_2IrO_4$, respectively, for 10-15 hours and then slowly cooled to room temperature at a rate of 4 C/hour. Platinum crucibles were used. The average sample size for $Ba_4Ir_3O_{10}$ is approximately $3\times2\times1$ mm$^3$ and smaller for $Ca_2RuO_4$ and $Sr_2IrO_4$. Measurements of crystal structures were performed using a Bruker Quest ECO single-crystal diffractometer equipped with a PHOTON 50 CMOS detector. It is also equipped with an Oxford Cryosystem that creates sample temperature environments ranging from 80 K to 400 K during x-ray diffraction measurements.

Chemical analyses of the samples were performed using a combination of a Hitachi MT3030 Plus Scanning Electron Microscope and an Oxford Energy Dispersive X-Ray Spectroscopy (EDX). Magnetic properties were measured using a Quantum Design (QD) MPMS-7 SQUID Magnetometer with a rotator that enables angular measurements of magnetic properties. Standard four-lead measurements of the electrical resistivity were carried out using a QD Dynacool PPMS System equipped with a 14-Tesla magnet. The heat capacity was measured down to 0.05 K using a dilution refrigerator for the PPMS.

Two permanent magnets, each of which is of 1.4 Tesla and 8" in diameter, are aligned and mounted on the two opposite sides of a 1500 C box furnace. Since the magnetic field of a permanent magnet decays with distance d as $1/d^3$, the resultant strength of the applied magnetic field inside the furnace chamber varies from 0.02 to 0.06 Tesla, sensitively depending on the location.

Raman scattering measurements were performed using a 671 nm diode-pumped solid-state laser in a back-scattering geometry. Scattered light was collected and focused onto the entrance slit of a custom McPherson triple stage spectrometer equipped with a liquid-nitrogen-cooled CCD detector. Field-altered and non-altered samples of $Sr_2IrO_4$ were cleaved in air to achieve a mirror-like surface before being loaded into a closed-cycle refrigerator.

The non-altered single crystals are synthesized without the applied magnetic field in otherwise identical conditions. All results are repeatedly confirmed by samples from multiple batches of single crystals synthesized throughout the nearly one-year period of this study. The field-altered single crystals are of high-quality and purity. The modified synthesis conditions due to field altering change the equilibrium point (i.e., the bond angle and hence the physical properties) or create a new minimum and hence a different phase, as compared to the synthesis conditions without magnetic field.

The experiments illustrated here serve as proof-of-concept results; the field-altering technology with much stronger magnetic fields will result in more discoveries of quantum states and materials.

The tiny fields of 200 gauss sufficient for field-altering involve a magnetic Zeeman energy scale of only 0.002 meV per spin-½, orders of magnitude smaller than typical electronic energy scales. While high temperature magnetohydrodynamic effects are expected to also play a role here similar to the role they play in other systems, an additional, qualitatively new mechanism is necessary to explain the present observations.

These experiments suggest a proof of concept of a qualitatively new mechanism for field altering, based on a combined effect of (1) strong SOI or magnetoelastic coupling, and (2) magnetic frustration. As an example, consider the square lattice quantum compass model, a term argued to arise in the effective description of $Sr_2IrO_4$ and, by symmetry considerations, of $Ca_2RuO_4$. For this model, the degeneracy of the manifold containing each state, and the divergent negative free energy for defect states, implies that even infinitesimally small magnetic fields have a singular and large effect on the free energy landscape.

The spin orbit and magnetoelastic couplings imply that each defect in the effective spin texture also produces a change in the local orbitals and local distortions of the crystal. When the full Hamiltonian still results in magnetic frustration, as indeed is observed in all three non-altered compounds discussed herein, the frustrated system no longer has degenerate manifolds but instead shows a glass-like landscape of states, some of which lie nearby in energy but have drastically different spin configurations. During synthesis of materials with this free energy landscape, even a small magnetic field can have a large effect on the dynamics of the crystal distortion relaxation and electronic structure. The propose mechanism could serve as a starting point for eventually reaching a full understanding of field altering at high temperatures.

In short, all experimental results presented herein demonstrate that the field-altering technology is extraordinarily effective for modifying quantum states in correlated and spin-orbit-coupled materials. With stronger magnetic fields, this technology should overcome more materials challenges, leading to more discoveries of quantum states and materials that cannot be produced otherwise.

Figure 9:
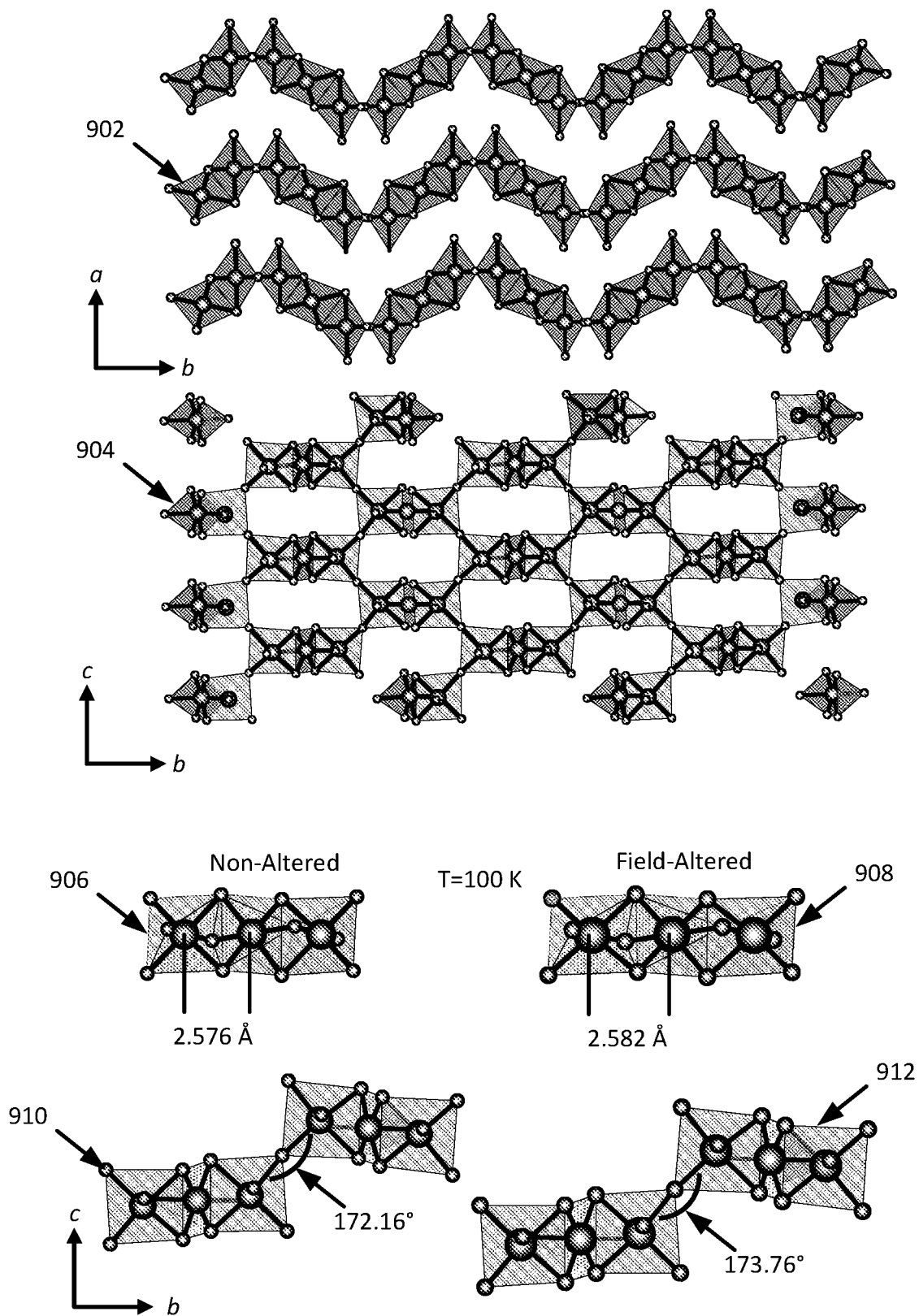
FIG. 9 illustrates the effect of field-editing on the crystal structure of $Ba_4Ir_3O_{10}$.

The magnetic insulator $Ba_4Ir_3O_{10}$ was recently found to be a quantum liquid. As shown in FIG. 9, $Ba_4Ir_3O_{10}$ is structurally a two-dimensional, square lattice with no apparent spin chains. $Ba_4Ir_3O_{10}$ is a quantum liquid persisting down to 0.2 K with Curie-Weiss temperature, $\theta_{CW}$, ranging from −766 K to −169 K due to magnetic anisotropy. The anisotropy-averaged frustration parameter, defined as $f=|\theta_{CW}|/T_N$, is more than 2000, seldom seen in other materials. Heat capacity and thermal conductivity are both linear at low temperatures, a defining characteristic for an exotic quantum liquid state.

The novelty of the state is that frustration occurs in an apparently un-frustrated square lattice which features $Ir_3O_{12}$ trimers of face-sharing $IrO_6$ octahedra. It is these trimers that play a crucial role in frustration. In particular, a combined effect of the direct (Ir—Ir) and superexchange (Ir—O—Ir) interactions in the trimers results in such a delicate coupling that the middle Ir ion in a trimer is relatively weakly linked to the two neighboring Ir ions. Pure inter-trimer couplings generate an effective one-dimensional system with zigzag chains or Luttinger liquids along the c axis; restoring the relatively weak but crucial intra-trimer couplings can preserve a 1D or 2D quantum liquid.

This intricacy is fundamentally changed in the field-altered $Ba_4Ir_3O_{10}$. Structurally, the field-altered single crystal exhibits a significant elongation in the b axis with only slight changes in the a and c axis. As a result, the unit cell volume V increases considerably by up to 0.54% at 350 K (see FIG. 8). Remarkably, both the Ir—Ir bond distance within each trimer and the Ir—O—Ir bond angle between trimers increase sizably as illustrated in FIG. 9.

Figure 8:
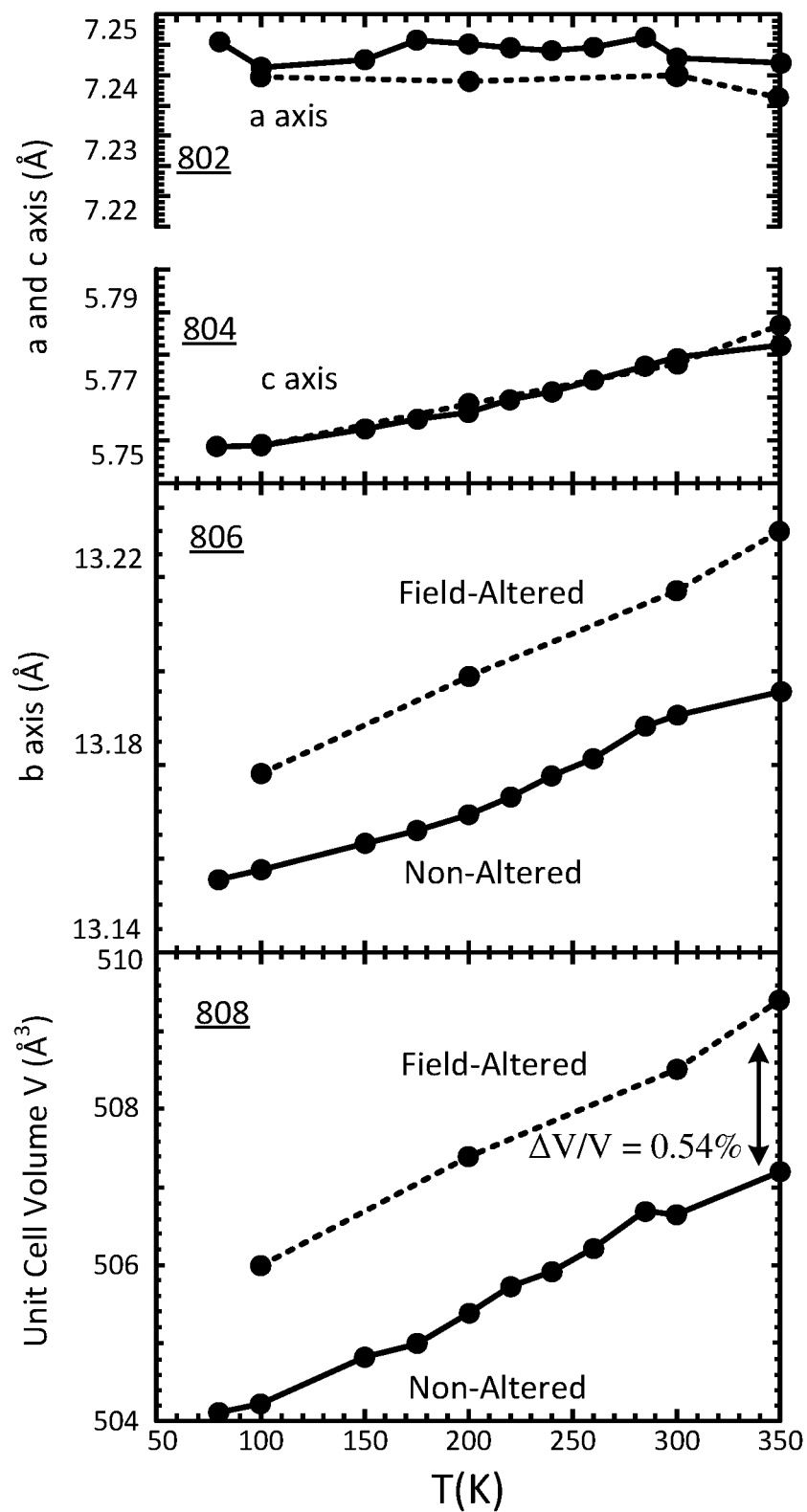
FIG. 8 illustrates the effect of field-editing on structural properties of $Ba_4Ir_3O_{10}$.

FIG. 8 illustrates the effect of field-editing on structural properties of $Ba_4Ir_3O_{10}$. FIG. 8 illustrates the temperature dependence of the lattice parameters the a axis 802 and c axis 804, the b axis 806, and the unit cell volume V 808. In these illustrations data from field-altered crystals have dashed lines, while data from non-altered crystals have solid lines.

FIG. 9 illustrates the effect of field-editing on the crystal structure of $Ba_4Ir_3O_{10}$. The crystal structure in the ab plane 902 and the crystal structure in the be plane 904 are illustrated here. The Ir—Ir bond distance within a trimer in non-altered crystals 906 and field-altered crystals 908 is illustrated. The Ir—O—Ir bond angle between corner-sharing trimers (the marked values are for 100 K) are illustrated for non-altered crystals 910 and for field-altered crystals 912.

The effect of field-altering readily destroys the quantum liquid and stabilizes a robust, long-range magnetic order. As shown in FIG. 10, two magnetic anomalies occur at Neel temperatures $T_N$=125 K and $T_{N2}$=12 K in the field-altered sample (solid lines), sharply contrasting the magnetic behavior of the non-altered sample (dashed lines). Consequently, the absolute values of the Curie-Weiss temperature $\theta_{CW}$ are considerably reduced and become comparable to $T_N$=125 K for the field-altered sample (FIG. 11); the corresponding frustration parameter f (=$|\theta_{CW}|/T_N$) is drastically reduced to a value less than 3 from 2000 for the non-altered sample, indicating a complete removal of frustration. The long-range magnetic order is corroborated by a metamagnetic transition at a critical field $\mu_oH_c$=2.5 T along the a axis, as shown in FIG. 10.

The heat capacity, which measures bulk effects, confirms the antiferromagnetic (AFM) order. In particular, the low-temperature linearity of the heat capacity C(T) (dashed lines in FIG. 12), which characterizes the gapless excitations in the non-altered (dashed lines) sample, is replaced by the $T^3$-dependence in the field-altered (solid lines) sample, which is anticipated for an insulating antiferromagnet (solid lines in FIG. 12). The sharp upturn in C(T) at T*=0.2 K in the non-altered (dashed lines) sample also disappears in the field-altered (solid lines) sample. As temperature rises, two anomalies occur at $T_{N2}$=12 K (FIG. 12) and $T_N$=125 K (FIG. 12), respectively, confirming the robustness of the long-range magnetic order. In short, the quantum liquid in the non-altered $Ba_4Ir_3O_{10}$ is replaced by the AFM state in the field-altered $Ba_4Ir_3O_{10}$.

Figure 11:
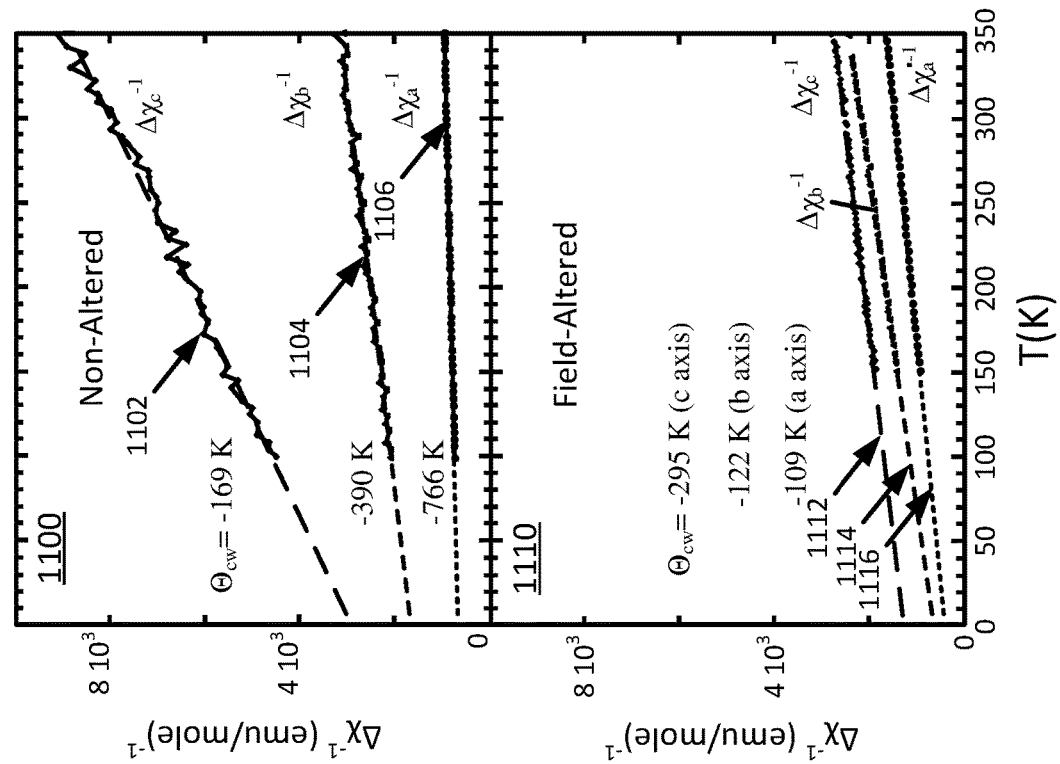
Figure 12:
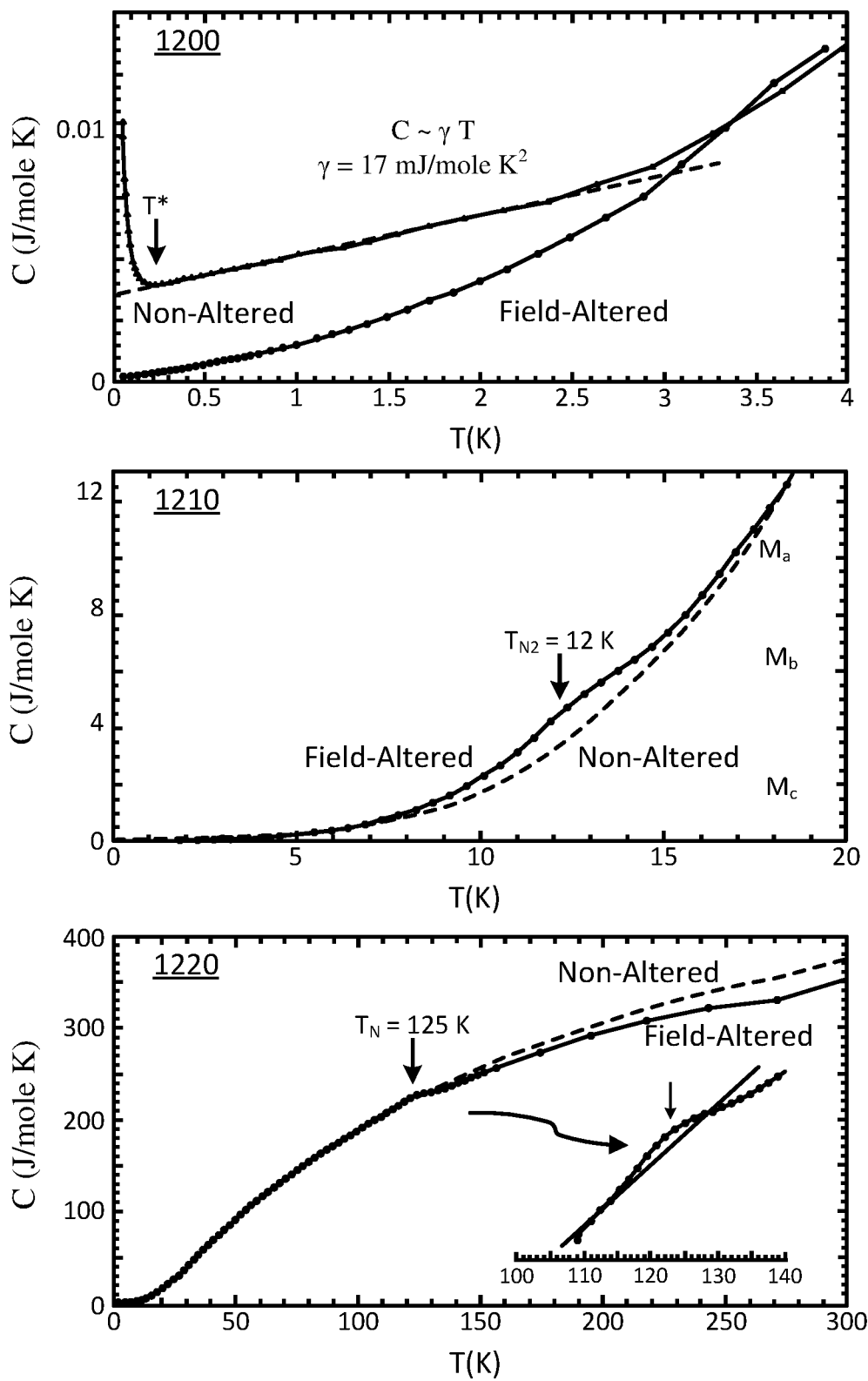

FIGS. 10-12 illustrate the effect of field-editing on physical properties of $Ba_4Ir_3O_{10}$. FIG. 10 illustrates the temperature dependence for the a, b and c axis of the magnetic susceptibility $\chi(T)$ 1000 for the field-altered (solid lines) (Inset: zoomed-in $\chi$ near $T_N$), and the non-altered (dashed lines) samples, and the isothermal magnetization M(H) at 1.8 K 1010 for the field-altered (solid lines) and the non-altered (dashed lines) samples.

FIG. 11 illustrates the temperature dependence for the a axis 1106, b axis 1104, and c axis 1102 of $\Delta\chi^{-1}$ for the non-altered single crystal 1100, and the a axis 1116, b axis 1114, and c axis 1112 of $\Delta\chi^{-1}$ for the field-altered single crystal 1110.

FIG. 12 illustrates the temperature dependence of the heat capacity C(T) for the field-altered (solid lines) and the non-altered (dashed lines) samples at the lowest temperatures 1200, the intermediate temperatures 1210, and high temperatures 1220. The inset in 1220 illustrates the zoomed-in C(T) near $T_N$.

The AFM insulator $Ca_2RuO_4$ exhibits a metal-insulator transition at $T_{MI}$=357 K, which marks a concomitant, violent structural transition with a severe rotation and tilt of $RuO_6$. This structural transition removes the $t_{2g}$ orbital degeneracy ($d_{xy}$, $d_{yz}$, $d_{zx}$), which dictates the physical properties of $Ca_2RuO_4$. An AFM transition occurs only at a considerably lower Neel temperature $T_N$=110 K, highlighting its close association with a further distorted structure.

Figure 14:
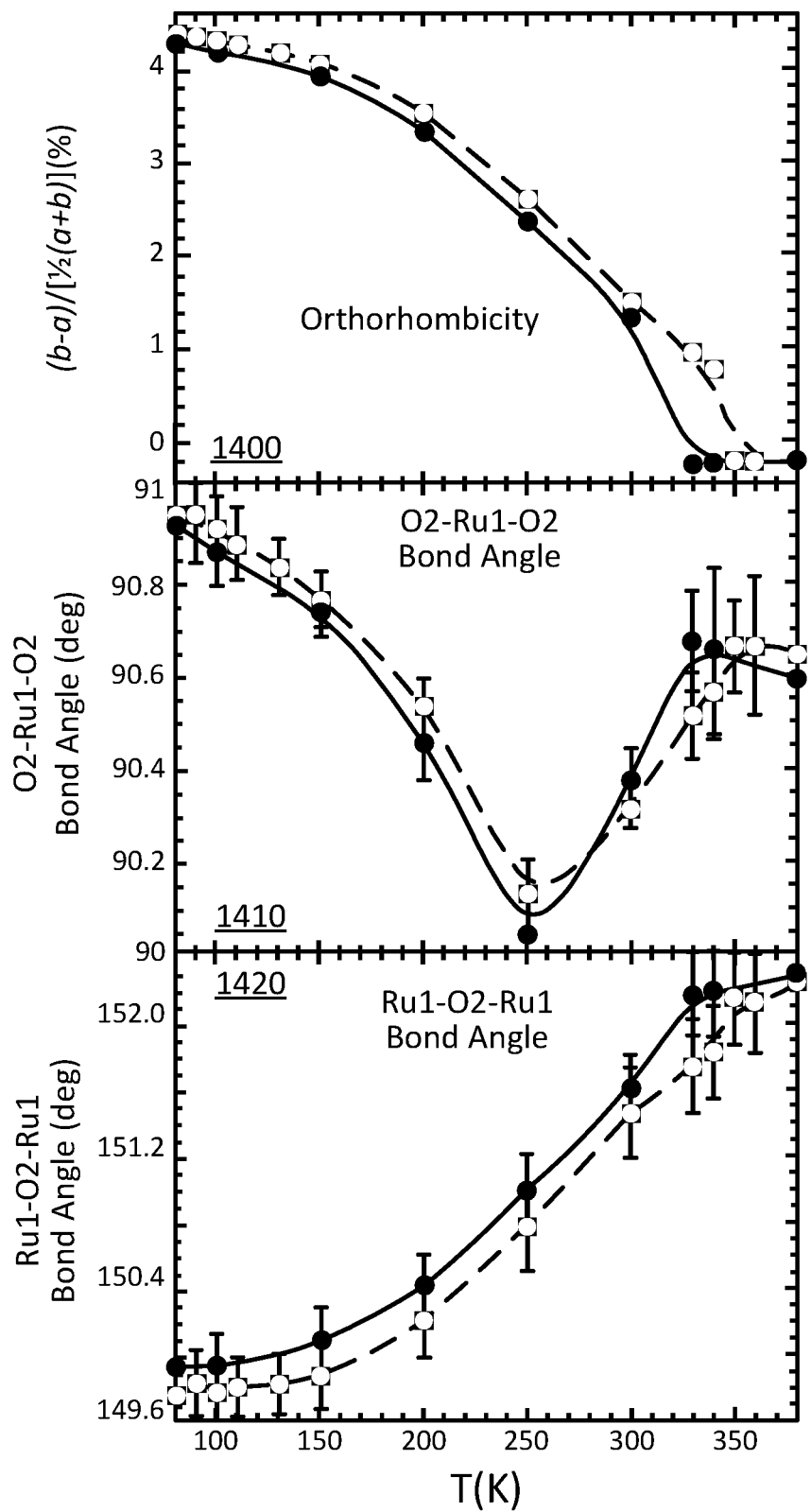
Figure 15:
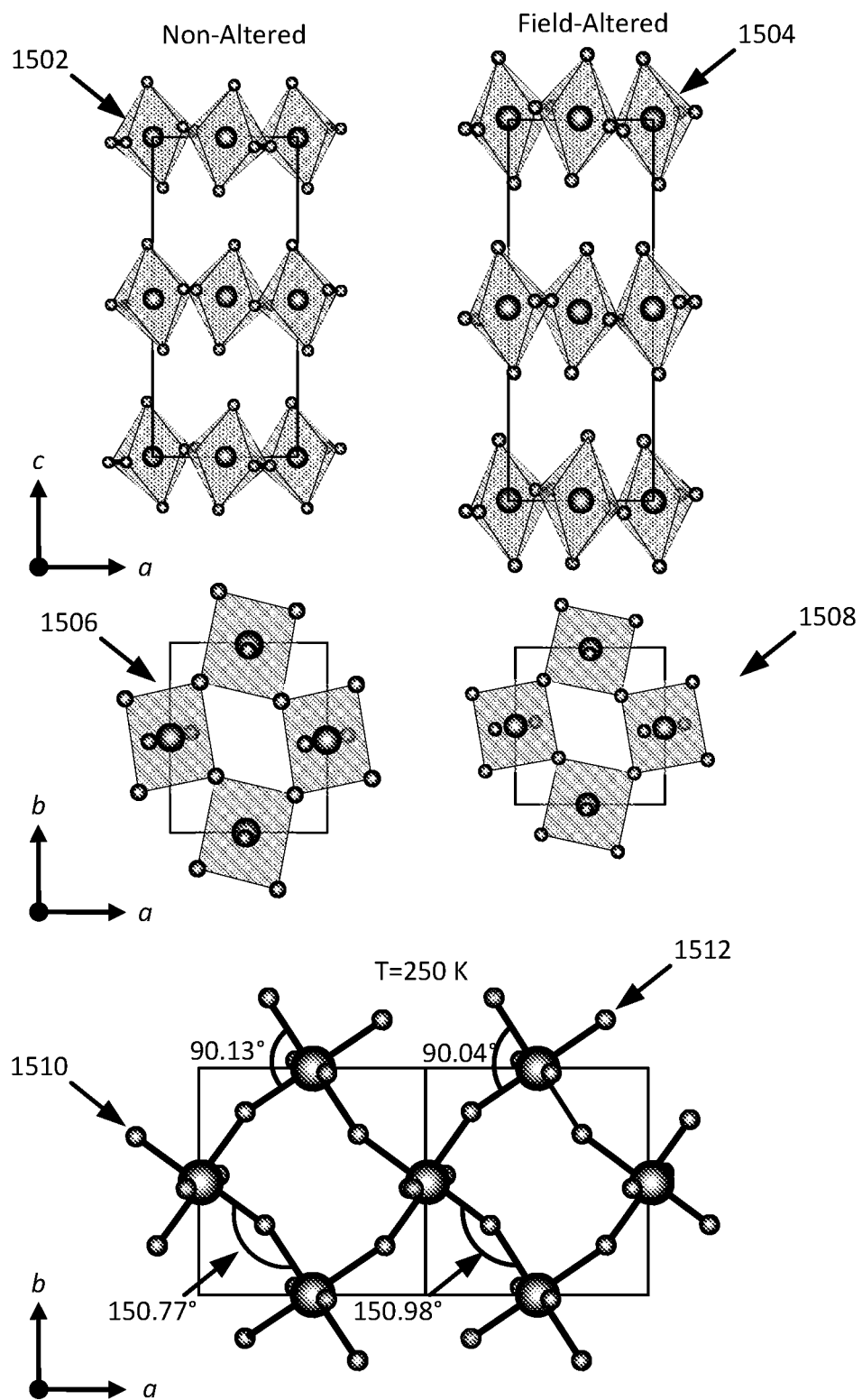
FIG. 15 illustrates the effect of field-editing on the crystal structure of $Ca_2RuO_4$.

As shown in FIG. 15, the crystal structure of $Ca_2RuO_4$ is significantly field-altered, becoming less distorted. A few changes are particularly remarkable. The first-order structural transition $T_{MI}$ is suppressed by about 25 K from 357 K to 332 K, which is marked by the vertical dashed and solid lines, respectively, in FIG. 13. In the field-altered structure, the c axis gets longer (FIG. 13); the b axis becomes shorter whereas the a axis changes very slightly (FIG. 13), thus leading to a reduced orthorhombicity (FIG. 14).

More importantly, the O2-Ru1-O2 and Ru1-O2-Ru1 bond angles, which measure the octahedral rotation and tilt, get relaxed, in the field-altered structure (FIG. 14). These lattice changes are critical to both transport and magnetic properties. The crystal structure in the ac and ab planes and the schematic for the bond angles are shown in FIG. 15. Remarkably, the structural alterations are more significant at high temperatures than at low temperatures. However, changes in the physical properties are drastic at low temperatures, as seen below, suggesting high sensitivity of the electronic structure to even slight changes in the lattice, particularly, the bond angles.

Figure 16:
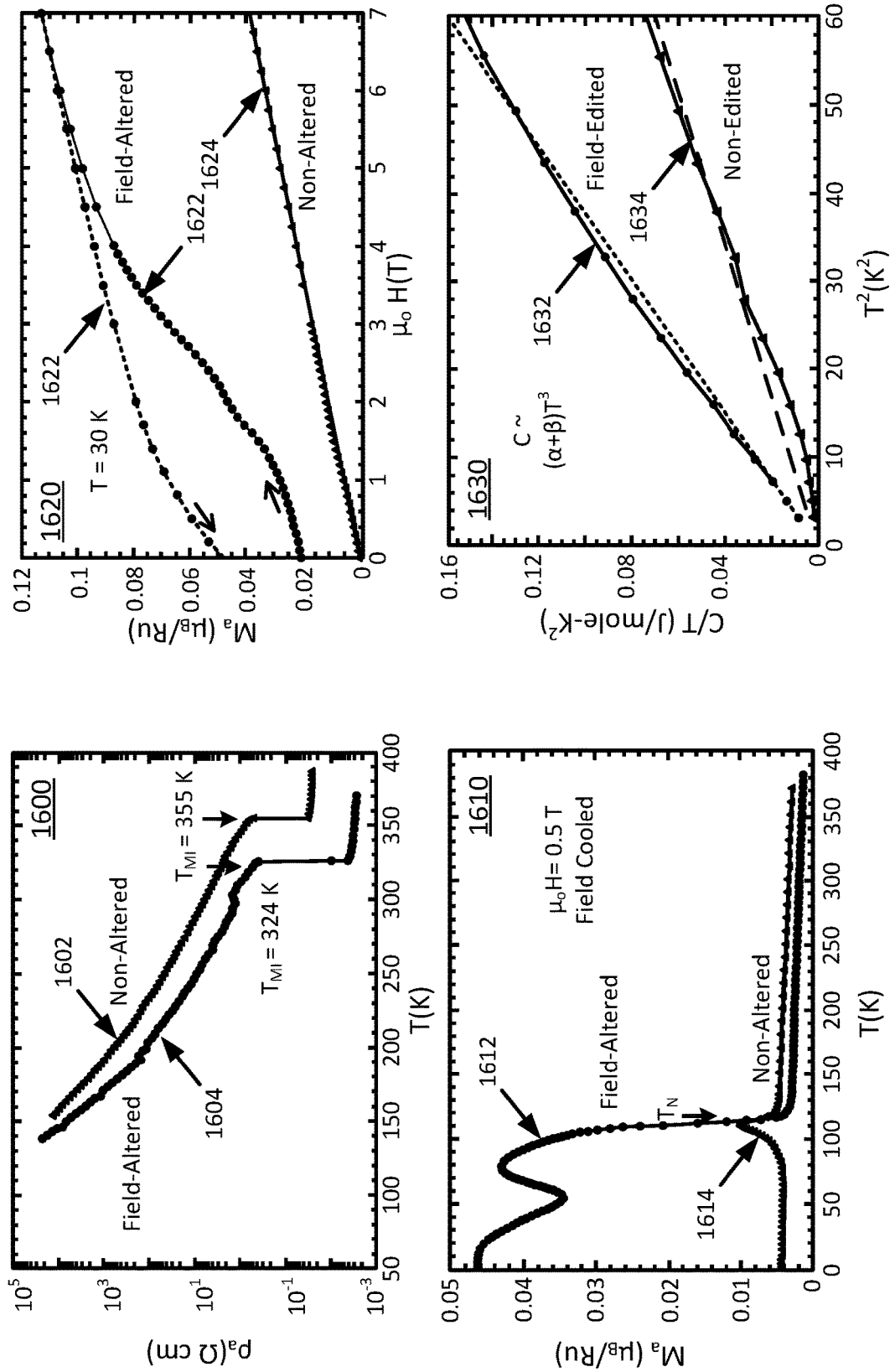
FIG. 16 illustrates the effect of field-editing on physical properties of $Ca_2RuO_4$.

Indeed, the a-axis electrical resistivity $\rho_a$ of the field-altered sample shows a much lower metal-insulator transition $T_{MI}$ at 324 K, 31 K lower than $T_{MI}$ for the non-altered sample, as seen in FIG. 16. The suppressed $T_{MI}$ closely tracks the structural transition that is reduced by about 25 K in the field-altered sample (FIGS. 13-15).

Magnetically, the field-altered sample behaves vastly differently from the non-altered sample. In particular, the a-axis magnetization $M_a$ of the field-altered sample shows a ferromagnetic-like behavior with a distinct temperature dependence below $T_N$, in sharp contrast to that of the non-altered sample (see FIG. 16). Moreover, a large hysteresis behavior of $M_a$ is also observed in the field-altered sample, which is expected in a ferromagnet or weak ferromagnet, as illustrated in FIG. 16. This behavior is in sharp contrast to that of the non-altered $Ca_2RuO_4$. The magnetic changes are also in accordance with changes in the low-temperature heat capacity C(T). For an insulating antiferromagnet, $C(T) \sim (\alpha + \beta) T^3$, in which the first term $\alpha$ and the second term $\beta$ are associated with magnon and phonon contributions to C(T), respectively. Here, C(T) shows a significant slope change defined by $(\alpha+\beta)$ in the plot of C/T vs $T^2$ in FIG. 16. Such a slope change clearly points out that the emergent magnetic state is distinctly different from the native AFM state, consistent with the magnetic data in FIG. 16.

Figure 13:
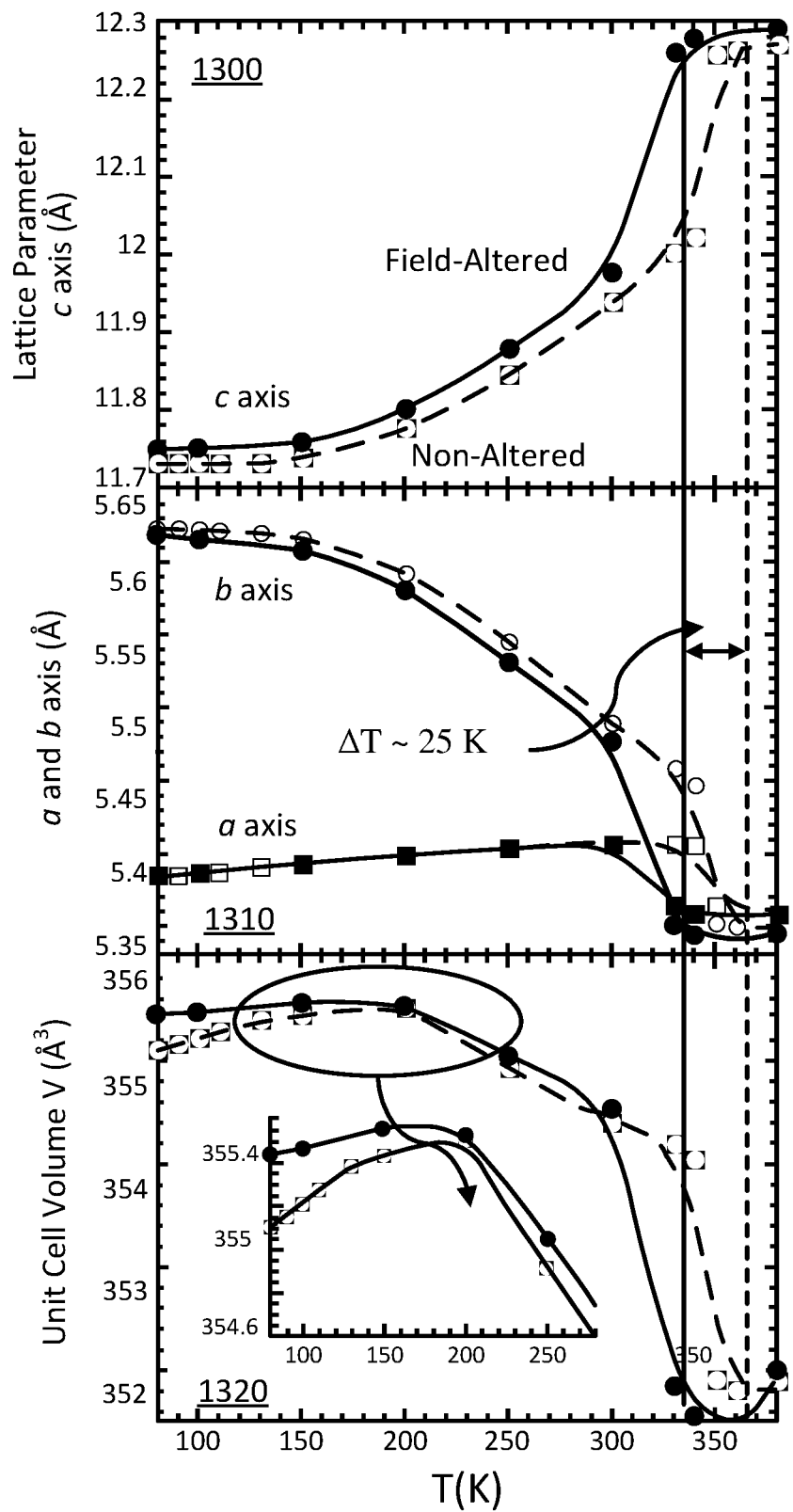
FIGS. 13 and 14 illustrate the effect of field-editing on structural properties of $Ca_2RuO_4$.

FIGS. 13 and 14 illustrate the effect of field-editing on structural properties of $Ca_2RuO_4$. FIG. 13 illustrates the temperature dependence of the lattice parameters the c axis 1300, the a and b axis 1310, the unit cell volume V 1320. FIG. 14 illustrates the temperature dependence of the lattice parameters the basal plane orthorhombicity 1400, the O2-Ru1-O2 bond angle 1410, and the Ru1-O2-Ru1 bond angle 1420. Note that the error bars are defined as standard deviation (s.d.). In these illustrations data from field-altered crystals have solid lines, while data from non-altered crystals have dashed lines.

FIG. 15 illustrates the effect of field-editing on the crystal structure of $Ca_2RuO_4$. The crystal structure in the ac plane for non-altered crystals 1502 and field altered crystals 1504 and in the ab plane for non-altered crystals 1506 and field-altered crystals 1508 are illustrated. FIG. 15 also illustrates a schematic for the O2-Ru1-O2 and Ru1-O2-Ru1 bond angles for the field-altered 1512 and non-altered 1510 structures at 250 K.

FIG. 16 illustrates the effect of field-editing on physical properties of $Ca_2RuO_4$. FIG. 16 illustrates the temperature dependence of the a-axis electrical resistivity $\rho_a$ 1600 for field altered crystals 1604 and non-altered crystals 1602, and the a-axis magnetic susceptibility $M_a(T)$ at $\mu_o H$=0.5 T 1610 for field-altered crystals 1612 and non-altered crystals 1614. FIG. 16 also illustrates the a-axis isothermal magnetization $M_a(H)$ at 30 K 1620 for field-altered crystals 1622 and non-altered crystals 1624. FIG. 16 further illustrates the low-temperature heat capacity C(T) plotted as C/T vs $T^2$ 1630 for field-altered crystals 1632 and non-altered crystals 1634.

$Sr_2IrO_4$ is an archetype of the spin-orbit-coupled magnetic insulator. It is widely anticipated that with slight electron doping, $Sr_2IrO_4$ should be a novel superconductor. However, there has been no experimental confirmation of superconductivity, despite many years of experimental effort. The absence of the predicted superconductivity may be due to inherently severe structural distortions that suppress superconductivity. A recent theoretical study similarly attributes the lack of superconductivity to the octahedral rotation. A recent neutron study reveals an anomalous change in the Ir—O—Ir bond angle below 50 K, which directly links to the anomalous transport and magnetic properties in $Sr_2IrO_4$.

Indeed, the structural and physical properties of the field-altered $Sr_2IrO_4$ and 3% La doped $Sr_2IrO_4$ are drastically improved, compared to those of the non-altered samples. In particular, the field-altered structure is less distorted with a greater Ir—O—Ir bond angle (FIG. 17), and the AFM transition $T_N$ is suppressed by astonishing 90 K (FIG. 18); the isothermal magnetization is reduced by 50% and much less "saturated" compared to that for the non-altered $Sr_2IrO_4$. That the Ir—O—Ir bond angle dictates $T_N$ and M suggests a critical role of the Dzyaloshinskii-Moriya interaction.

Indeed, such magnetic changes are clearly reflected in Raman scattering. One-magnon Raman scattering measures the anisotropy field that pins the magnetic moment orientation. It broadens with increasing temperature and vanishes at $T_N$. At 10 K, this peak in the non-altered $Sr_2IrO_4$ occurs near 18 cm$^{-1}$ (dashed lines in FIG. 18) but is absent in the field-altered $Sr_2IrO_4$ for the measured energy range (solid lines in FIG. 18). This conspicuous disappearance of the peak indicates that the anisotropy field is drastically reduced and, consequently, the one-magnon peak is either completely removed or suppressed to an energy below the energy cutoff of 5.3 cm$^{-1}$ (0.67 meV) in the field-altered sample. On the other hand, two-magnon scattering remains essentially unchanged. Note the broadened peak in the field-altered sample in FIG. 18 is a result of the weakened AFM state.

Figure 19:
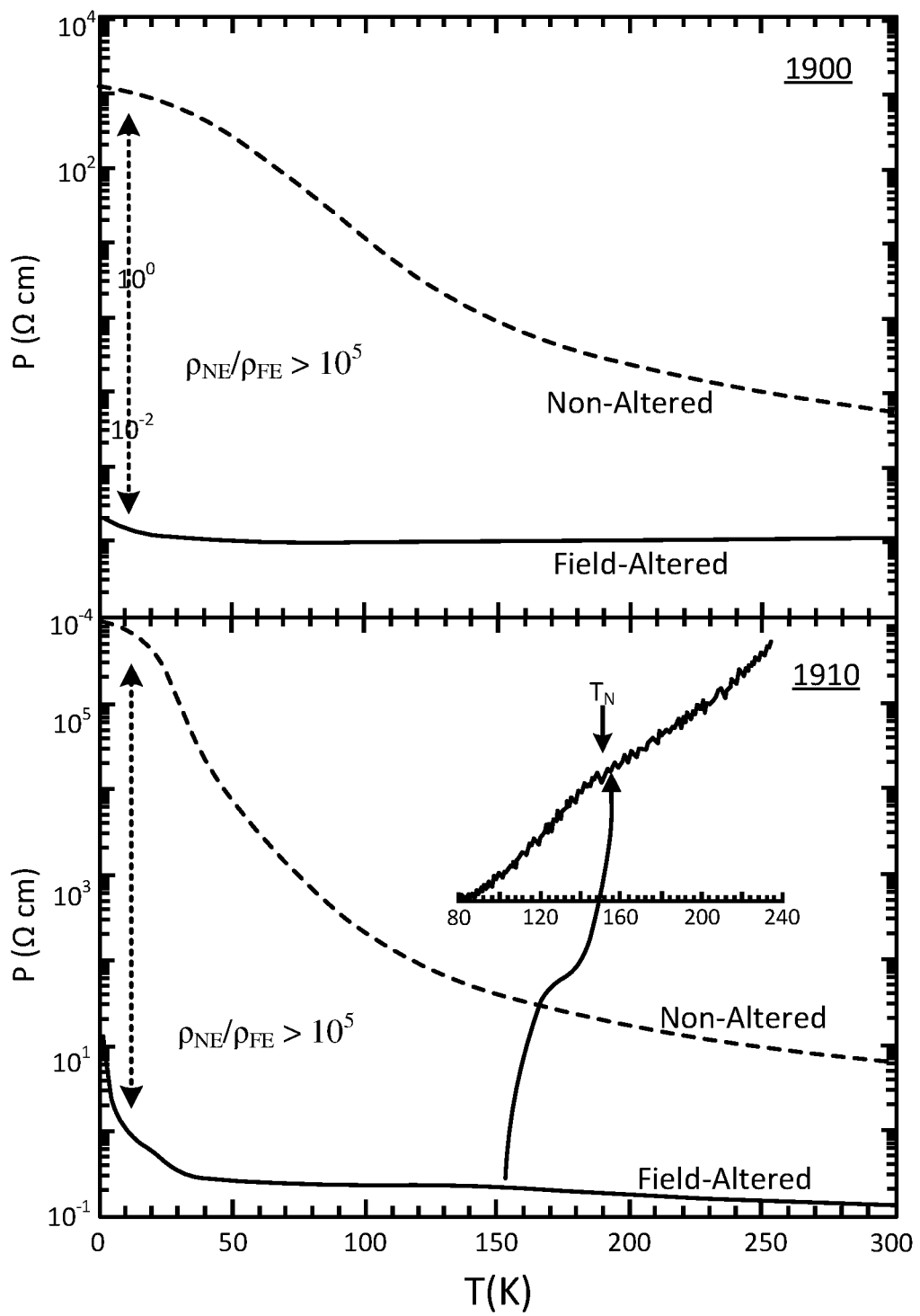
FIG. 19 shows the change in electrical resistivity due to field editing $Sr_2IrO_4$.

Furthermore, the electrical resistivity for both the a and c axis, $\rho_a$ and $\rho_c$, is reduced by up to five orders of magnitude and shows a nearly metallic behavior at high temperatures in the field-altered $Sr_2IrO_4$ (FIG. 19). This is consistent with the effect of the relaxed Ir—O—Ir bond angle, which enhances electron hopping. Note that the hugely reduced resistivity also rules out any potential crystalline imperfectness caused by field altering. An anomaly corresponding to $T_N$=150 K (Inset in FIG. 19) indicates a close correlation between the transport and magnetic properties that is noticeably absent in the non-altered $Sr_2IrO_4$. The resistivity for the field-altered $(Sr_{0.97}La_{0.03})_2IrO_4$ exhibits an abrupt drop below 20 K by nearly three orders of magnitude, suggesting that the long-elusive superconductivity in the iridate may be finally within reach.

Figure 17:
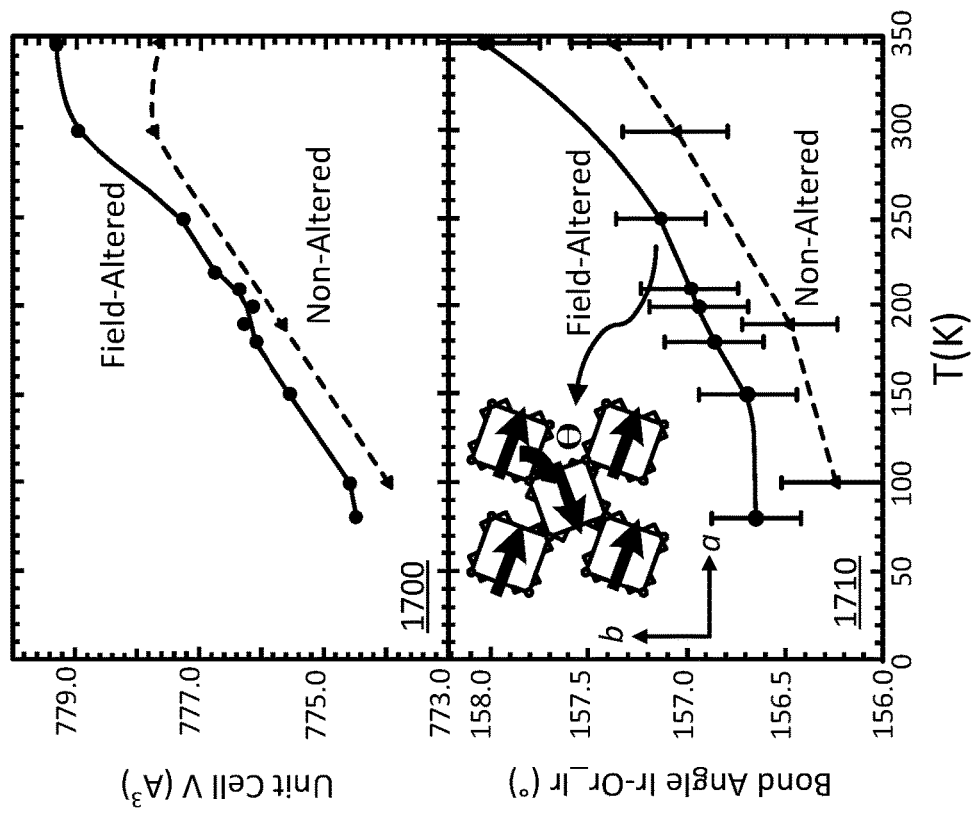
FIG. 17 illustrate effects of field editing on the crystal lattice parameters of $Sr_2IrO_4$.

FIG. 17 illustrate effects of field editing on the crystal lattice parameters of $Sr_2IrO_4$. FIG. 17 demonstrates the temperature dependence of the change in unit cell volume (V) 1700 with field edited sample exhibiting a larger unit volume (V). FIG. 17 shows that the Ir—O—Ir bond angle θ (the inset illustrates θ) 1710 is significantly different between the field-edited and non-edited single crystals of $Sr_2IrO_4$ with field edited samples having a greater bond angle. Note that the error bars are defined as standard deviation (s.d.).

Figure 18:
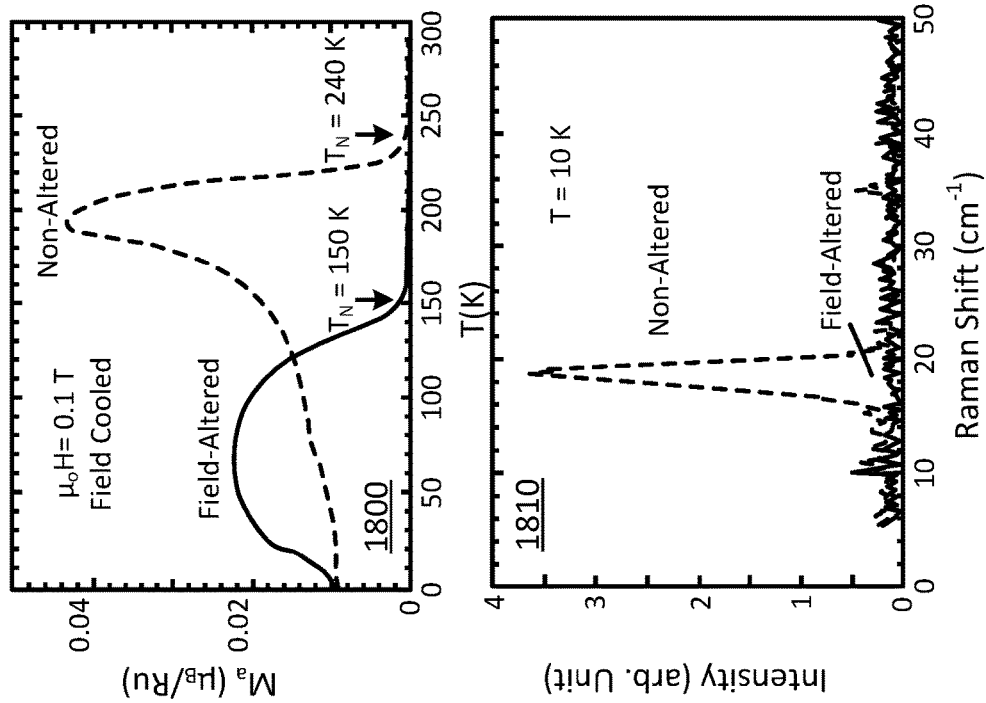
FIG. 18 demonstrates the effects of field-editing $Sr_2IrO_4$.

FIG. 18 demonstrates the effects of field-editing $Sr_2IrO_4$. FIG. 18 illustrates the change in a-axis magnetization 1800 where there is a significant difference between the edited and non-edited samples. FIG. 18 shows further effects of field-editing. The magnetic peak and the absence of it in the Raman spectra at 10 K of $Sr_2IrO_4$ 1810 indicate vast differences magnetically between the non-edited and field-edited crystals.

FIG. 19 shows the change in electrical resistivity due to field editing. FIG. 19 illustrates the temperature dependence of the a-axis resistivity $\rho_a$ 1900 and the c-axis resistivity $\rho_c$ for $Sr_2IrO_4$ 1910. Note that both $\rho_a$ and $\rho_c$ drop by up to five orders of magnitude. Inset: the anomaly in $\rho_a$ at $T_N$ for the field-altered crystal.

Figure 20:
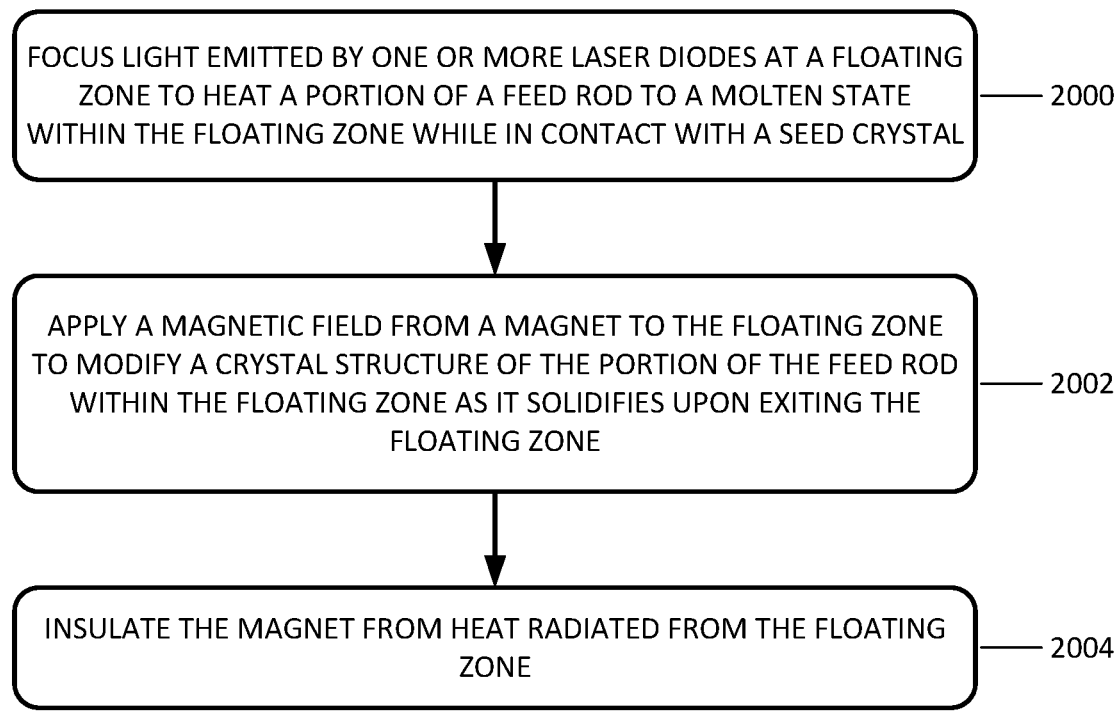
FIG. 20 is a flowchart illustrating an example of a set of operations to structurally edit crystals in accordance with various embodiments of the present technology.

FIG. 20 is a flowchart illustrating an example of a set of operations to structurally edit crystals in accordance with various embodiments of the present technology. In this example embodiment, light emitted by one or more laser diodes is focused at a floating zone to heat a portion of a feed rod to a molten state within the floating zone while in contact with a seed crystal, (operation 2000).

A magnetic field from a magnet is applied to the floating zone in order to modify a crystal structure of the portion of the feed rod within the floating zone as it solidifies upon exiting the floating zone, (operation 2002). The magnet is insulated from heat radiated from the floating zone, (operation 2004).

The technology disclosed herein is utterly inconsistent with conventional thermodynamics, according to which even an extremely strong magnetic field (e.g., 45 Tesla~4 meV) would seem inconsequential to chemical reactions as magnetic contributions to the Gibbs free enthalpy are too small to be significant in terms of energy. Indeed, previous literature on applying magnetic fields during crystal growth of silicon and protein crystals were limited to changes such as surface patterns of the grown crystals. No reports have ever showed synthesis effects of applied magnetic field on structural and physical properties.

All materials (e.g., silicon, protein) involved in the previous synthesis efforts with an applied magnetic field do not have two key ingredients included in the disclosed technology: strong spin-orbit interactions and multiple nearly degenerate states. These two characteristics define spin-orbit-coupled and correlated materials, such as 4d- and 5d-transition metal oxides and chalcogenides. The crystal structures of these materials tend to be inherently distorted and the physical properties are extremely susceptible to even slight structural changes—a less than one-degree change in octahedral rotations/tilts can cause a change in the ground state because the strong spin-orbit interactions uniquely, tightly couple the lattice to spin/orbital degrees of freedom.

The hopping matrix elements of the d electrons depends strongly on the rotating/tilting angle and so does the superexchange via the Kanamori rules. Hence, small changes in bond angles can cause disproportionately large changes in the physical properties. An excellent case in point is a pair of ruthenates: superconducting $Sr_2RuO_4$ and insulating $Ca_2RuO_4$ in which the octahedral rotations/tilts or the lack of them separate the two isostructural, isoelectronic ruthenates.

During crystal growth, magnetic spins naturally interact with a magnetic field, and electrons in a liquid state generates electrical current, and this current must also interact with the applied field, as a result, affecting convection, thus synthesis. More importantly, what makes the technology work so effectively for spin-orbit-coupled materials are the two elements mentioned above, or a combined effect of (a) strong spin-orbit interactions and magnetoelastic coupling, and (b) magnetic frustration, which produces nonequilibrium dynamics that are able to modify the physical properties even for very small applied magnetic fields. Note that the Zeeman effect exerts a torque on the spin, which couples to the orbit via the spin-orbit interactions. The orbit needs to readjust and thus tilts the octahedron. The degeneracy of the manifold containing each state imply that even infinitesimally small magnetic fields during synthesis can have a singular and large effect on the free energy landscape, thus the dynamics of the crystal distortion relaxation and electronic structure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is in a particular claim format, other aspects may likewise be embodied claim of that form, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A method for producing structurally modified crystals, the method comprising:
   focusing light emitted by one or more laser diodes at a floating zone to heat a portion of a feed rod to a molten state within the floating zone while in contact with a seed crystal, wherein the portion of the feed rod comprises a composition of matter having strong spin-orbit interactions and multiple nearly degenerate states;
   applying a magnetic field from a magnet to the floating zone to modify a crystal structure of the portion of the feed rod within the floating zone as the portion of the feed rod solidifies from the molten state to a solid state upon exiting the floating zone; and
   insulating the magnet from heat radiated from the floating zone.

2. The method of claim 1, wherein insulating the magnet from the heat radiated from the floating zone comprises removing a total amount of heat from the floating zone equal to a total amount of heat applied to the floating zone by the one or more laser diodes.

3. The method of claim 1, wherein the magnet is a superconductive magnet operating at a temperature below a critical temperature of the superconductive magnet.

4. The method of claim 1, wherein insulating the magnet from the heat radiated from the floating zone is performed by a heat sink positioned between the floating zone and the magnet to prevent transfer of heat between the floating zone and the magnet.

5. The method of claim 4, wherein the heat sink is operatively coupled to a refrigeration system.

6. The method of claim 1, further comprising reflecting, through use of one or more radiation shields, at least a portion of the heat radiated from the floating zone, back to the floating zone.

7. The method of claim 1, further comprising creating a vacuum to surround the floating zone.

8. The method of claim 1, wherein the composition of matter is a compound comprising a 4d or 5d transition metal.

9. A method for producing structurally modified crystals, the method comprising:
   focusing light emitted by one or more laser diodes at a metal crucible within a molten zone to heat material within the metal crucible to a molten state;
   applying a magnetic field from a magnet to the molten zone to modify a crystal structure of the material within the metal crucible as it solidifies as a temperature of the metal crucible is lowered; and
   insulating the magnet from heat radiated from the molten zone.

10. A system for producing structurally modified crystals, wherein the system is configurable to create a molten zone within the system in a first configuration and is configurable to create a floating zone within the system in a second configuration, the system comprising:
    one or more laser diodes configured to apply thermal energy to material within either the floating zone or a metal crucible within the molten zone, transitioning the material to a molten state conducive for crystal growth;
    a magnet configured to generate a magnetic field within the molten zone or the floating zone to modify a crystal structure of the material as the material solidifies from the molten state to a solid state upon exiting the floating zone, or as a temperature of the molten zone is lowered; and
    an insulation system comprising a heat sink and one or more passive radiation shields positioned between the molten zone and the magnet.

11. The system of claim 10, wherein the magnet is a superconductive magnet operating at a temperature below a critical temperature of the superconductive magnet.

12. The system of claim 10, wherein the heat sink is operatively coupled to a refrigeration system.

13. The system of claim 10, wherein the one or more radiation shields are configured to reflect at least a portion of the heat radiated from the molten zone or the floating zone, back to the molten zone or the floating zone.

14. The system of claim 10, further comprising a region of vacuum surrounding the molten zone or the floating zone for thermal insulation between the molten zone or the floating zone and the magnet.

15. The system of claim 10, wherein the material comprises a rotating feed rod and a seed crystal, the rotating feed rod configured to absorb thermal energy supplied by the one or more laser diodes within the floating zone, and the seed crystal configured to initiate crystal growth.

16. The system of claim 10, wherein a total thermal energy supplied by the one or more laser diodes is equal to a total amount of thermal energy removed by the insulation system.

17. The system of claim 10, further comprising a vacuum chamber, the vacuum chamber enclosing at least the magnet, the one or more laser diodes, the molten zone, and the insulation system.

18. The system of claim 10 wherein the material comprises a composition of matter having strong spin-orbit interactions and multiple nearly degenerate states.

19. The system of claim 18, wherein the composition of matter is a compound comprising a 4d or 5d transition metal.

* * * * *